US012619148B2

(12) United States Patent
Yang et al.

(10) Patent No.: US 12,619,148 B2
(45) Date of Patent: May 5, 2026

(54) CROSSLINKABLE PHOTORESIST FOR EXTREME ULTRAVIOLET LITHOGRAPHY

(71) Applicant: Taiwan Semiconductor Manufacturing Co., Ltd., Hsinchu (TW)

(72) Inventors: Li-Po Yang, Hsinchu (TW); Wei-Han Lai, Hsinchu (TW); Ching-Yu Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 923 days.

(21) Appl. No.: 17/734,981

(22) Filed: May 2, 2022

(65) Prior Publication Data

US 2023/0350295 A1 Nov. 2, 2023

(51) Int. Cl.
*G03F 7/039* (2006.01)
*G03F 7/20* (2006.01)
*G03F 7/26* (2006.01)

(52) U.S. Cl.
CPC .............. *G03F 7/0392* (2013.01); *G03F 7/20* (2013.01); *G03F 7/2004* (2013.01); *G03F 7/26* (2013.01)

(58) Field of Classification Search
CPC ............. G03F 7/20; G03F 7/2004; G03F 7/26
See application file for complete search history.

(56) References Cited

U.S. PATENT DOCUMENTS

2004/0265743 A1 12/2004 Lee et al.
2006/0128914 A1 6/2006 Allen et al.
2010/0266958 A1* 10/2010 Endou .................. G03F 7/0046 430/296
2013/0157463 A1 6/2013 Goldfarb et al.
2015/0160552 A1* 6/2015 Lai .......................... G03F 7/322 430/319
2016/0147154 A1* 5/2016 Takizawa .............. G03F 7/0045 430/311
2020/0135451 A1 4/2020 Zi et al.
2020/0218154 A1* 7/2020 Sasami ................. G03F 7/0392
2023/0367210 A1* 11/2023 Yoshimura ............ G03F 7/0046

FOREIGN PATENT DOCUMENTS

TW 202136913 A 10/2021
WO WO-2022158326 A1 * 7/2022 ............. G03F 7/004

OTHER PUBLICATIONS

Endo et al., "Theoretical study on structural effects of polymer ionization for EUV resist", 2012, Proc. of SPIE, vol. 8325, 83251F-1 to 83251F-9. (Year: 2012).*

* cited by examiner

*Primary Examiner* — Mark F. Huff
*Assistant Examiner* — Anna Malloy
(74) *Attorney, Agent, or Firm* — Seed IP Law Group

(57) ABSTRACT

A method for forming a semiconductor device includes forming a photoresist layer over a substrate, exposing the photoresist layer to radiation to form a pattern therein, and selectively removing portions of the photoresist layer that are not exposed to the radiation to form a patterned photoresist layer. The photoresist layer comprises a fluorine-containing polymer, a crosslinker and a photoactive compound.

20 Claims, 10 Drawing Sheets

302 304 306

402 404 406

CROSSLINKABLE PHOTORESIST FOR EXTREME ULTRAVIOLET LITHOGRAPHY

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
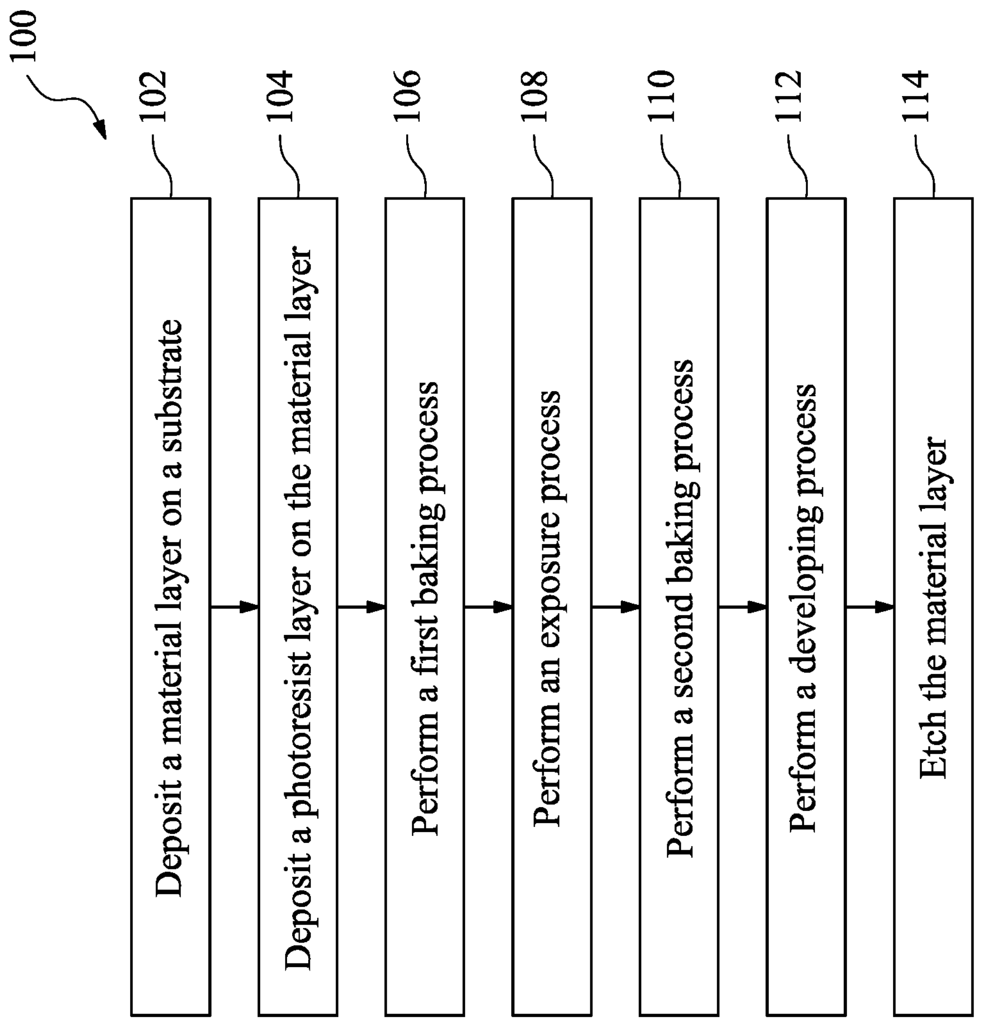
FIG. 1 is a flow chart of a method for fabricating a semiconductor device, in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. System may be otherwise oriented (rotated 90 degrees or at other orientations) and the spatially relative descriptors used herein may likewise be interpreted accordingly.

"Alkyl" by itself or as part of another substituent, refers to a straight or branched hydrocarbon chain group consisting solely of carbon and hydrogen atoms, containing no unsaturation, having from one to twelve carbon atoms (C1-C12 alkyl), one to eight carbon atoms (C1-C8 alkyl) or one to six carbon atoms (C1-C6 alkyl), and which is attached to the rest of the molecule by a single bond, e.g., methyl, ethyl, n-propyl, 1-methylethyl (iso-propyl), n-butyl, n-pentyl, 1,1-dimethylethyl (t-butyl), 3-methylhexyl, 2-methylhexyl, and the like. Unless stated otherwise specifically in the specification, an alkyl group is optionally substituted.

"Alkylene" as used herein refers to a straight or branched divalent hydrocarbon chain linking the rest of the molecule to a radical group, consisting solely of carbon and hydrogen, containing no unsaturation, and having from one to twelve carbon atoms, e.g., methylene, ethylene, propylene, n-butylene, ethenylene, propenylene, n-butenylene, propynylene, n-butynylene, and the like. The alkylene chain is attached to the rest of the molecule through a single bond and to the radical group through a single bond. The points of attachment of the alkylene chain to the rest of the molecule and to the radical group can be through one carbon or any two carbons within the chain. Unless stated otherwise specifically in the specification, an alkylene group is optionally substituted.

"Alkene" as used herein refers to a straight or branched hydrocarbon chain consisting solely of carbon and hydrogen, containing at least one carbon-carbon double bond and having from two to twelve carbon atoms, e.g., ethylene, propylene, n-butylene, and the like. Unless stated otherwise specifically in the specification, an alkene group is optionally substituted.

"Alkenyl" as used herein refers to a straight or branched divalent hydrocarbon chain linking the rest of the molecule to a radical group, consisting solely of carbon and hydrogen, containing at least one double bond, having from two to twelve carbon atoms, e.g., ethenyl, propenyl, n-butenyl, and the like. Unless stated otherwise specifically in the specification, alkenyle is optionally substituted.

"Alkyne" as used herein refers to a straight or branched hydrocarbon chain consisting solely of carbon and hydrogen, containing at least one carbon-carbon triple bond and having from two to twelve carbon atoms, e.g., ethyne, propyne, n-butyne, and the like.

"Alknyl" as used herein refers to a straight or branched divalent hydrocarbon chain linking the rest of the molecule to a radical group, consisting solely of carbon and hydrogen, containing at least one triple bond, having from two to twelve carbon atoms, e.g., ethynyl, propynyl, n-butynyl, and the like. Unless stated otherwise specifically in the specification, alkenyl is optionally substituted.

"Alkoxy" as used herein refers to an O-alkyl group in which the alkyl is defined above. Unless stated otherwise specifically in the specification, an alkoxy group is optionally substituted.

"Alkylether" as used herein refers to any alkyl group as defined above, wherein at least one carbon-carbon bond is replaced with a carbon-oxygen bond. The carbon-oxygen bond may be on the terminal end (as in an alkoxy group) or the carbon oxygen bond may be internal (i.e., C—O—C). Alkylethers include at least one carbon oxygen bond, but may include more than one. For example, polyethylene glycol (PEG) is included within the meaning of alkylether. Unless stated otherwise specifically in the specification, an alkylether group is optionally substituted.

"Cycloalkyl" as used herein refers to a stable non-aromatic monocyclic or polycyclic carbocyclic radical consisting solely of carbon and hydrogen atoms, which may include fused or bridged ring systems, having from three to fifteen carbon atoms, preferably having from three to ten carbon atoms, and which is saturated or unsaturated and attached to the rest of the molecule by a single bond. Monocyclic radicals include, for example, cyclopropyl, cyclobutyl, cyclopentyl, cyclohexyl, cycloheptyl, and cyclooctyl. Polycyclic radicals include, for example, adamantyl, norbornyl, decalinyl, 7,7-dimethyl-bicyclo[2.2.1]heptanyl, and the like. "Cycloalkylene" is a divalent or multivalent cycloalkyl, which typically connects one portion a molecule to a radical group or connects two or more radical groups. Unless otherwise stated specifically in the specification, a cycloalkyl (or cycloalkylene) group is optionally substituted.

"Heteroalkyl" as used herein refers to an alkyl group, as defined above, comprising at least one heteroatom (e.g., N, O, P or S) within the alkyl group or at a terminus of the alkyl group. In some embodiments, the heteroatom is within the alkyl group (i.e., the heteroalkyl comprises at least one carbon-[heteroatom]$_x$-carbon bond, where x is 1, 2 or 3). In other embodiments, the heteroatom is at a terminus of the alkyl group and thus serves to join the alkyl group to the remainder of the molecule (e.g., M1-H-A), where M1 is a portion of the molecule, H is a heteroatom and A is an alkyl group). Unless stated otherwise specifically in the specification, a heteroalkyl group is optionally substituted. Exemplary heteroalkyl groups include ethylene oxide (e.g., polyethylene oxide), optionally including phosphorous-oxygen bonds, such as phosphodiester bonds.

"Heteroalkylene" as used herein refers to an alkylene group, as defined above, comprising at least one heteroatom (e.g., N, O, P or S) within the alkylene chain or at a terminus of the alkylene chain. In some embodiments, the heteroatom is within the alkylene chain (i.e., the heteroalkylene comprises at least one carbon-heteroatom-carbon bond). In other embodiments, the heteroatom is at a terminus of the alkylene and thus serves to join the alkylene to the remainder of the molecule (e.g., M1-H-A-M2, where M1 and M2 are portions of the molecule, H is a heteroatom and A is an alkylene). Unless stated otherwise specifically in the specification, a heteroalkylene group is optionally substituted.

"Heteroalkenyl" as used herein is a heteroalkylene, as defined above, comprising at least one carbon-carbon double bond. Unless stated otherwise specifically in the specification, a heteroalkenyl group is optionally substituted.

"Heteroalkynyl" as used herein is a heteroalkylene comprising at least one carbon-carbon triple bond. Unless stated otherwise specifically in the specification, a heteroalkynyl group is optionally substituted.

"Carbocyclic" refers to a stable 3- to 18-membered aromatic or non-aromatic ring comprising 3 to 18 carbon atoms. Unless stated otherwise specifically in the specification, a carbocyclic ring may be a monocyclic, bicyclic, tricyclic or tetracyclic ring system, which may include fused or bridged ring systems, and may be partially or fully saturated. Non-aromatic carbocyclyl radicals include cycloalkyl, while aromatic carbocyclyl radicals include aryl. Unless stated otherwise specifically in the specification, a carbocyclic group is optionally substituted.

"Aryl" employed alone or in combination with other terms (e.g., aryloxy, arylalkyl) refers to a ring system comprising at least one carbocyclic aromatic ring. In some embodiments, an aryl comprises from 6 to 18 carbon atoms. The aryl ring may be a monocyclic, bicyclic, tricyclic or tetracyclic ring system, which may include fused or bridged ring systems. Aryls include, but are not limited to, aryls derived from aceanthrylene, acenaphthylene, acephenanthrylene, anthracene, azulene, benzene, chrysene, fluoranthene, fluorene, as-indacene, s-indacene, indane, indene, naphthalene, phenalene, phenanthrene, pleiadene, pyrene, and triphenylene. Unless stated otherwise specifically in the specification, an aryl group is optionally substituted.

"Arylene" as used herein refers to a bifunctional aromatic moiety containing one to five aromatic rings. Unless stated otherwise specifically in the specification, an arylene group is optionally substituted.

"Heterocyclic" as used herein refers to a stable 3- to 18-membered aromatic or non-aromatic ring comprising one to twelve carbon atoms and from one to six heteroatoms selected from the group consisting of nitrogen, oxygen and sulfur. Unless stated otherwise specifically in the specification, the heterocyclic ring may be a monocyclic, bicyclic, tricyclic or tetracyclic ring system, which may include fused or bridged ring systems; and the nitrogen, carbon or sulfur atoms in the heterocyclic ring may be optionally oxidized; the nitrogen atom may be optionally quaternized; and the heterocyclic ring may be partially or fully saturated. Examples of aromatic heterocyclic rings are listed below in the definition of heteroaryls (i.e., heteroaryl being a subset of heterocyclic). Examples of non-aromatic heterocyclic rings include, but are not limited to, dioxolanyl, thienyl[1,3]dithianyl, decahydroisoquinolyl, imidazolinyl, imidazolidinyl, isothiazolidinyl, isoxazolidinyl, morpholinyl, octahydroindolyl, octahydroisoindolyl, 2-oxopiperazinyl, 2-oxopiperidinyl, 2-oxopyrrolidinyl, oxazolidinyl, piperidinyl, piperazinyl, 4-piperidonyl, pyrrolidinyl, pyrazolidinyl, pyrazolopyrimidinyl, quinuclidinyl, thiazolidinyl, tetrahydrofuryl, trioxanyl, trithianyl, triazinanyl, tetrahydropyranyl, thiomorpholinyl, thiamorpholinyl, 1-oxo-thiomorpholinyl, and 1,1-dioxo-thiomorpholinyl. Unless stated otherwise specifically in the specification, a heterocyclic group is optionally substituted.

"Heteroaryl" as used herein refers to a 5- to 14-membered ring system comprising one to thirteen carbon atoms, one to six heteroatoms selected from the group consisting of nitrogen, oxygen and sulfur, and at least one aromatic ring. For purposes of certain embodiments of this disclosure, the heteroaryl radical may be a monocyclic, bicyclic, tricyclic or tetracyclic ring system, which may include fused or bridged ring systems; and the nitrogen, carbon or sulfur atoms in the heteroaryl radical may be optionally oxidized; the nitrogen atom may be optionally quaternized. Examples include, but are not limited to, azepinyl, acridinyl, benzimidazolyl, benzthiazolyl, benzindolyl, benzodioxolyl, benzofuranyl, benzooxazolyl, benzothiazolyl, benzothiadiazolyl, benzo[b][1,4]dioxepinyl, 1,4-benzodioxanyl, benzonaphthofuranyl, benzoxazolyl, benzodioxolyl, benzodioxinyl, benzopyranyl, benzopyranonyl, benzofuranyl, benzofuranonyl, benzothienyl (benzothiophenyl), benzotriazolyl, benzo[4,6]imidazo[1,2-a]pyridinyl, benzoxazolinonyl, benzimidazolthionyl, carbazolyl, cinnolinyl, dibenzofuranyl, dibenzothiophenyl, furanyl, furanonyl, isothiazolyl, imidazolyl, indazolyl, indolyl, indazolyl, isoindolyl, indolinyl, isoindolinyl, isoquinolyl, indolizinyl, isoxazolyl, naphthyridinyl, oxadiazolyl, 2-oxoazepinyl, oxazolyl, oxiranyl, 1-oxidopyridinyl, 1-oxidopyrimidinyl, 1-oxidopyrazinyl, 1-oxidopyridazinyl, 1-phenyl-1H-pyrrolyl, phenazinyl, phenothiazinyl, phenoxazinyl, phthalazinyl, pteridinyl, pteridinonyl, purinyl, pyrrolyl, pyrazolyl, pyridinyl, pyridinonyl, pyrazinyl, pyrimidinyl, pryrimidinonyl, pyridazinyl, pyrrolyl, pyrido[2,3-d]pyrimidinonyl, quinazolinyl, quinazolinonyl, quinoxalinyl, quinoxalinonyl, quinolinyl, isoquinolinyl, tetrahydroquinolinyl, thiazolyl, thiadiazolyl, thieno[3,2-d]pyrimidin-4-onyl, thieno[2,3-d]pyrimidin-4-onyl, triazolyl, tetrazolyl, triazinyl, and thiophenyl (i.e., thienyl). Unless stated otherwise specifically in the specification, a heteroaryl group is optionally substituted.

"Heteroarylene" as used herein refers to a divalent aromatic hydrocarbon of 6-20 carbon atoms containing N, S, O or P.

"halo" or "halogen" as used herein includes fluorine, chlorine, bromine, and iodine.

"Halogenated" means having one or more halogen atoms, e.g., fluorine, chlorine, bromine, or iodine atoms, incorporated into the above groups.

"fluorinated" means having one or more fluorine atoms incorporated into the above groups, e.g., where a fluoroalkyl group is indicated, the group includes a single fluorine atom, a difluoromethylene group, a trifluoromethyl group, a combination of these, or is a perfluorinated group (e.g., $CF_3$, $C_2F5$, $C_3F_7$, $C_4F_9$, etc.).

The term "substituted" as used herein means any of the above groups (e.g., alkyl, alkylene, alkenyl, alkynyl, heteroalkylene, heteroalkenyl, heteroalkynyl, alkoxy, heteroalkyl, carbocyclic, cycloalkyl, aryl, arylene, heterocyclic, heteroaryl, and/or heteroarylene) wherein at least one hydrogen atom (e.g., 1, 2, 3 or all hydrogen atoms) is replaced by a bond to a non-hydrogen atoms such as, but not limited to: a halogen atom such as F, Cl, Br, and I; an oxygen atom in groups such as hydroxyl groups, alkoxy groups, and ester groups; a sulfur atom in groups such as thiol groups, thioalkyl groups, sulfone groups, sulfonyl groups, and sulfoxide groups; a nitrogen atom in groups such as amines, amides, alkylamines, dialkylamines, arylamines, alkylarylamines, diarylamines, N-oxides, imides, and enamines; a silicon atom in groups such as trialkylsilyl groups, dialkylarylsilyl groups, alkyldiarylsilyl groups, and triarylsilyl groups; and other heteroatoms in various other groups. "Substituted" also means any of the above groups in which one or more hydrogen atoms are replaced by a higher-order bond (e.g., a double- or triple-bond) to a heteroatom such as oxygen in oxo, carbonyl, carboxyl, and ester groups; and nitrogen in groups such as imines, oximes, hydrazones, and nitriles. For example, "substituted" includes any of the above groups in which one or more hydrogen atoms are replaced with $—NR_gR_h$, $—NR_gC(=O)R_h$, $—NR_gC(=O)NR_gR_h$, $—NR_gC(=O)OR_h$, $—NR_gSO_2R_h$, $—OC(=O)NR_gR_h$, $—OR_g$, $—SR_g$, $—SOR_g$, $—SO_2R_g$, $—OSO_2R_g$, $—SO_2OR_g$, $=NSO_2R_g$, and $—SO_2NR_gR_h$. "Substituted" also means any of the above groups in which one or more hydrogen atoms are replaced with $—C(=O)R_g$, $—C(=O)OR_g$, $—C(=O)NR_gR_h$, $—CH_2SO_2R_g$, and $—CH_2SO_2NR_gR_h$. In the foregoing, $R_g$ and $R_h$ are the same or different and independently hydrogen, alkyl, alkoxy, alkylamino, thioalkyl, aryl, aralkyl, cycloalkyl, cycloalkylalkyl, haloalkyl, heterocyclyl, N-heterocyclyl, heterocyclylalkyl, heteroaryl, N-heteroaryl, and/or heteroarylalkyl. "Substituted" further means any of the above groups in which one or more hydrogen atoms are replaced by a bond to an amino, cyano, hydroxyl, imino, nitro, oxo, thioxo, halo, alkyl, alkoxy, alkylamino, thioalkyl, aryl, aralkyl, cycloalkyl, cycloalkylalkyl, haloalkyl, heterocyclyl, N-heterocyclyl, heterocyclylalkyl, heteroaryl, N-heteroaryl, and/or heteroarylalkyl group. In addition, each of the foregoing substituents may also be optionally substituted with one or more of the above substituents.

IC fabrication uses one or more photolithography processes to transfer geometric patterns to a film or substrate. Geometric shapes and patterns on a semiconductor make up the complex structures that allow the dopants, electrical properties and wires to complete a circuit and fulfill a technological purpose. In a photolithography process, a photoresist is applied as a thin film to a substrate, and subsequently exposed to one or more types of radiation or light through a photomask. The photomask contains clear and opaque features that define a pattern which is to be created in the photoresist layer. Areas in the photoresist exposed to light transmitted through the photomask are made either soluble or insoluble in a specific type of solution known as a developer. In the case when the exposed areas are soluble, a positive image of the photomask is produced in the photoresist and this type of photoresist is called a positive photoresist. On the other hand, if the unexposed areas are dissolved by the developer, a negative image results in the photoresist and this type of photoresist is called a negative photoresist. The developer removes the more soluble areas, leaving the patterned photoresist in place. The resist pattern is then used as an etch mask in subsequent etching processes, transferring the pattern to an underlying material layer, thereby replicating the mask pattern in the underlying material layer. Alternatively, the resist pattern is then used as an ion implantation mask in subsequent ion implantation processes applied to the underlying material layer, such as an epitaxial semiconductor layer.

The quality of the resist pattern directly impacts the quality of the final ICs. As the critical dimension (CD) of the integrated circuit continues to shrink, the ability of the photoresist to perfectly replicate the photomask features becomes challenging due to an image blur that arises from photoacid diffusion.

In embodiments of the present disclosure, crosslinkable photoresist polymers with halogenated functional groups covalently bond to the polymer sidechains which provoke an increase in glass transition temperatures are developed. The higher glass transition temperatures (e.g., $T_g$>140° C.) provide dimensional stability to restrict photoacid diffusion length during the photolithography process, and thus enables smaller features, higher resolution and reduced line width roughness (LWR). As a result, the quality of the resist pattern is improved, which helps to improve the yield and the reliability of the device.

FIG. 1 is a flowchart illustrating a method 100 of fabricating a semiconductor device 200, in accordance with some embodiments of the present disclosure. FIGS. 2A through 2G are cross-sectional views of a semiconductor device 200 at various fabrication stages in accordance with some embodiments of the present disclosure. The method 100 is described below in conjunction with FIG. 1 and FIGS. 2A through 2G where the semiconductor device 200 is fabricated by using embodiments of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

The semiconductor device 200 may be an intermediate structure during the fabrication of an IC, or a portion thereof. The IC may include logic circuits, memory structures, passive components (such as resistors, capacitors, and inductors), and active components such as diodes, field-effect transistors (FETs), metal-oxide semiconductor field effect transistors (MOSFETs), complementary metal-oxide semiconductor (CMOS) transistors, bipolar transistors, high voltage transistors, high frequency transistors, fin-like FETs (FinFETs), other three-dimensional (3D) FETs, and combinations thereof. The semiconductor device 200 may include a plurality of semiconductor devices (e.g., transistors), which may be interconnected.

Figure 2A:
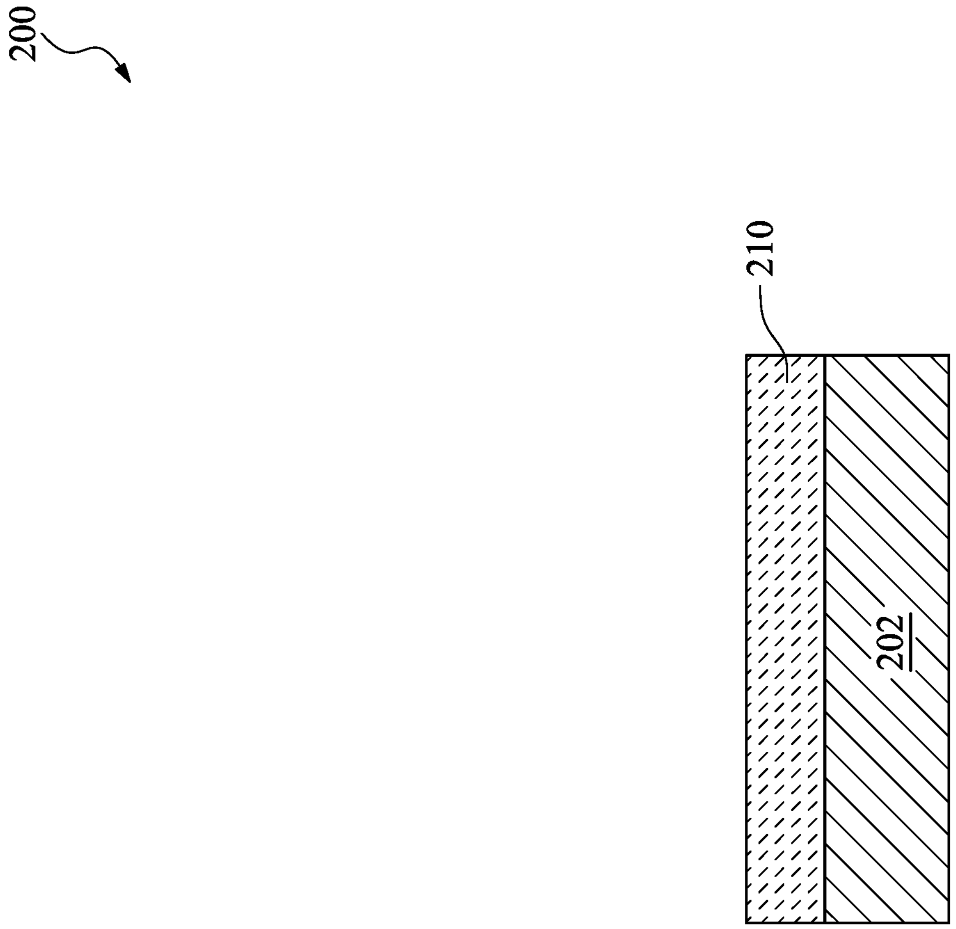
FIGS. 2A-2G are cross-sectional views of a semiconductor device fabricated using the method of FIG. 1, in accordance with some embodiments of the present disclosure.

Referring to FIGS. 1 and 2A, the method 100 includes operation 102, in which a material layer 210 is deposited on a substrate 202, in accordance with some embodiments. FIG. 2A is a cross-sectional view of the semiconductor device 200 after depositing the material layer 210 on the substrate 202, in accordance with some embodiments.

In some embodiments, the substrate 202 may be a bulk semiconductor substrate including one or more semiconductor materials. In some embodiments, the substrate 202 may include silicon, silicon germanium, carbon doped silicon (Si:C), silicon germanium carbide, or other suitable semiconductor materials. In some embodiments, the substrate 202 is composed entirely of silicon.

In some embodiments, the substrate 202 may include one or more epitaxial layers formed on a top surface of a bulk semiconductor substrate. In some embodiments, the one or more epitaxial layers introduce strains in the substrate 202 for performance enhancement. For example, the epitaxial layer includes a semiconductor material different from that of the bulk semiconductor substrate, such as a layer of silicon germanium overlying bulk silicon or a layer of silicon overlying bulk silicon geranium. In some embodiments, the epitaxial layer(s) incorporated in the substrate 202 are formed by selective epitaxial growth, such as, for example, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), or combinations thereof.

In some embodiments, the substrate 202 may be a semiconductor-on-insulator (SOI) substrate. In some embodiments, the SOI substrate includes a semiconductor layer, such as a silicon layer formed on an insulator layer. In some embodiments, the insulator layer is a buried oxide (BOX) layer including silicon oxide or silicon germanium oxide. The insulator layer is provided on a handle substrate such as, for example, a silicon substrate. In some embodiments, the SOI substrate is formed using separation by implanted oxygen (SIMOX) or other suitable technique, such as wafer bonding and grinding.

In some embodiments, the substrate 202 may also include a dielectric substrate such as silicon oxide, silicon nitride, silicon oxynitride, a low-k dielectric, silicon carbide, and/or other suitable layers.

In some embodiments, the substrate 202 may also include various p-type doped regions and/or n-type doped regions, implemented by a process such as ion implantation and/or diffusion. Those doped regions include n-well, p-well, lightly doped region (LDD) and various channel doping profiles configured to form various IC devices, such as a COMOS transistor, imaging sensor, and/or light emitting diode (LED). The substrate 202 may further include other functional features such as a resistor and/or a capacitor formed in and/or on the substrate 202.

In some embodiments, the substrate 202 may also include various isolation features. The isolation features separate various device regions in the substrate 202. The isolation features include different structures formed by using different processing technologies. For example, the isolation features may include shallow trench isolation (STI) features. The formation of an STI may include etching a trench in the substrate 202 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

In some embodiments, the substrate 202 may also include gate stacks formed by dielectric layers and electrode layers. The dielectric layers may include an interfacial layer and a high-k dielectric layer deposited by suitable techniques, such as chemical vapor deposition (CVD), atomic layer deposition (ALD), physical vapor deposition (PVD), thermal oxidation, combinations thereof, and/or other suitable techniques. The interfacial layer may include silicon dioxide and the high-k dielectric layer may include LaO, AlO, ZrO, TiO, $Ta_2O_5$, $Y_2O_3$, $SrTiO_3$, $BaTiO_3$, BaZrO, HfZrO, HfLaO, HfSiO, LaSiO, AlSiO, HfTaO, HfTiO, $(Ba,Sr)TiO_3$ (BST), $Al_2O_3$, $Si_3N_4$, SiON, and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The electrode layer may include Ti, Ag, Al, TiAlN, TaC, TaCN, TaSiN, Mn, Zr, TiN, TaN, Ru, Mo, Al, WN, Cu, W, any suitable materials, and/or a combination thereof.

In some embodiments, the substrate 202 may also include a plurality of inter-level dielectric (ILD) layers and conductive features integrated to form an interconnect structure configured to couple the various p-type and n-type doped regions and the other functional features (such as gate electrodes), resulting in a functional integrated circuit. In one example, the substrate 202 may include a portion of the interconnect structure and the interconnect structure may include a multi-layer interconnect (MLI) structure and an ILD layer integrated with a MLI structure, providing an electrical routing to couple various devices in the substrate 202 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The material layer 210 is disposed on the substrate 202. The material layer 210 is a layer to be processed by the method 100, such as to be pattered or to be implanted. In some embodiments, the material layer 210 is a hardmask layer to be patterned. In some embodiments, the material layer 210 includes a dielectric material such as silicon oxide, silicon nitride, or silicon oxynitride. In some other embodiments, the material layer 210 includes a metal oxide such as titanium oxide or a metal nitride such as titanium nitride. In some embodiments, the material layer 210 also serves as an anti-reflection coating (ARC) layer whose composition is chosen to minimize reflectivity of radiation implemented during exposure of the photoresist layer 220. For example, in some embodiments, the material layer 210 includes silicon oxide, silicon oxygen carbide, or plasma enhanced chemical vapor deposited silicon oxide. The material layer 210 may be formed by any suitable process including chemical vapor deposition (CVD), physical vapor deposition (PVD), plasma enhanced chemical vapor deposition (PECVD), atomic layer deposition (ALD), or spin coating, and may be formed to any suitable thickness.

Figure 2B:
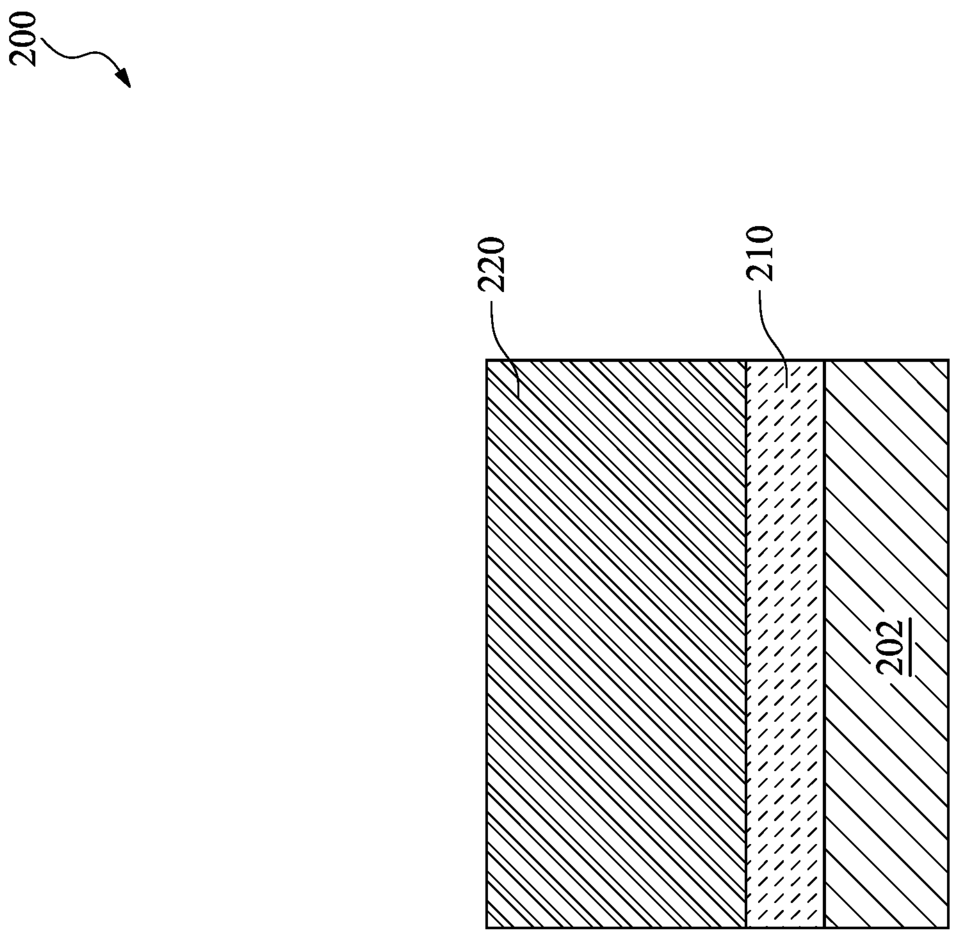

Referring to FIGS. 1 and 2B, the method 100 proceeds to operation 104, in which a photoresist composition is coated on the material layer 210 to form a photoresist layer 220, in accordance with some embodiments. FIG. 2B is a cross-sectional view of the semiconductor device 200 after forming the photoresist layer 220 on the material layer 210, in accordance with some embodiments.

The photoresist layer 220 is a photosensitive layer that is patternable by exposure to actinic radiation. In some embodiments, the photoresist layer 220 is sensitive to ultraviolet radiation. In some embodiments, the ultraviolet radiation is deep ultraviolet (DUV) radiation. In some embodiments, the ultraviolet radiation is extreme ultraviolet (EUV) radiation. In some embodiments, the radiation is an electron beam.

In some embodiments, the photoresist composition includes a polymer, a crosslinker, one or more photoactive compounds (PACs), and a solvent.

In some embodiments, the polymer of the present disclosure has the following structure (I):

(I)

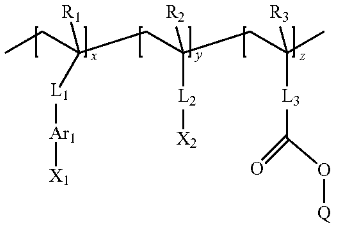

wherein $L_1$, $L_2$ and $L_3$ are, at each occurrence, independently a direct bond or a linker selected from an oxy (—O—) group, a carboxyl (—C(═O)—) group, a carbonyloxy (—C(═O)—O—) group, a oxycarbonyl (—O—C(═O)—) group, a carbonate (—O—C(═O)—O—) group, a halogenated or non-halogenated alkylene group, a halogenated or non-halogenated cycloalkylene group, a halogenated or non-halogenated oxyalkylene (—O-alkylene) group, a halogenated or non-halogenated oxycycloalkylene (—O-cycloalkylene) group, a halogenated or non-halogenated carbonyloxyalkylene (—C(═O)—O-alkylene) group, a halogenated or non-halogenated heteroalkylene group, or a halogenated or non-halogenated cycloheteroalkylene group.

$Ar_1$ is, at each occurrence, independently a halogenated or non-halogenated arylene group or a halogenated or non-halogenated heteroarylene group.

Q is, at occurrence, independently an acid labile group.

$X_1$ and $X_2$ are, at each occurrence, independently a reactive group, or protected form thereof, capable of forming a covalent bond with a crosslinker.

$R_1$, $R_2$ and $R_3$ are, at each occurrence, independently H, alkyl or alkoxy.

x and z are independently an integer of one or greater, and y is an integer of zero or greater. In some embodiments, x is an integer from 10 to 80, y is an integer from 0 to 70, z is an integer from 20 to 90. A portion of x, y and z in the polymer is $0<x/(x+y+z)<1$, $0\leq y/(x+y+z)<1$ and $0<z/(x+y+z)<1$.

In structure (I), at least one of $L_1$, $L_2$ or $Ar_1$ is halogenated. In some embodiments, at least one of $L_1$, $L_2$ or $Ar_1$ is fluorinated.

In some embodiments, $L_1$ or $L_3$, or both, is a direct bond, and $L_2$ is carbonyloxy or fluoroalkylene. In other embodiments, $L_1$, $L_2$ and $L_3$ are each independently carbonyloxy or fluoroalkylene. For example, in some embodiments, $L_1$, $L_2$ and $L_3$ independently have one of the following structures:

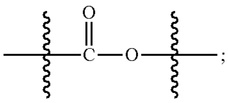 ; 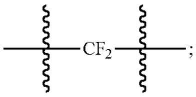 ;

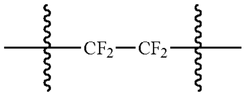 or 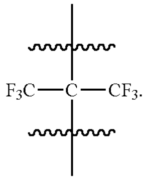.

In some embodiments, $Ar_1$ has one of the following structures:

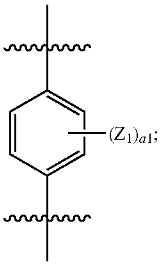 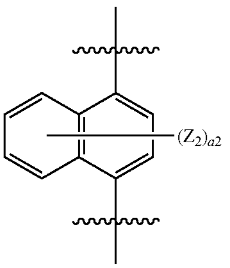 or

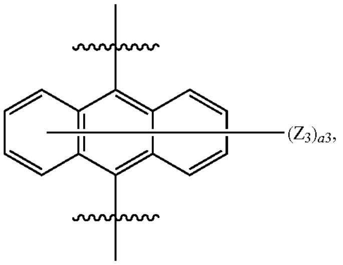

wherein:

$Z_1$, $Z_2$ and $Z_3$ are, at each occurrence, independently F or fluoroalkyl;

$a_1$ is an integer from 0 to 4;

$a_2$ is an integer from 0 to 6; and $a_3$ is an integer from 0 to 8.

In some embodiments, $Ar_1$ has one of the following structures:

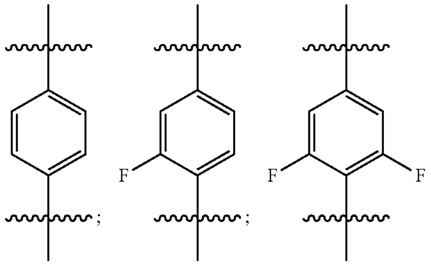

or

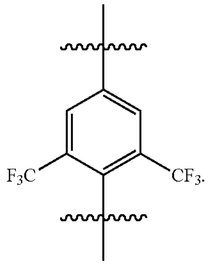

The acid labile group on the polymer decomposes or is cleaved when exposed to an acid, base or free radical generated by the PAC. In some embodiments, Q is, at each occurrence, independently an alkyl group, a cycloalkyl group, a hydroxyalkyl group, an alkoxy group, an alkoxy alkyl group, or a three-dimensional (3D) ring structure. In some embodiments, the 3D ring structure is an adamantyl, cedryl, norbornyl, or tricyclodecanyl structure. In some embodiments, Q has one of the following structures:

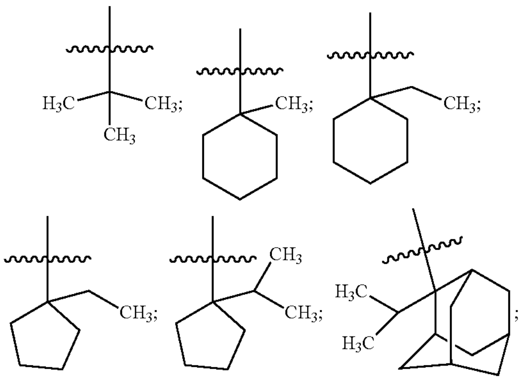

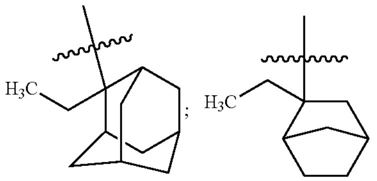

or

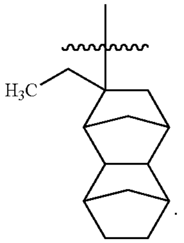

In some embodiments, $X_1$ and $X_2$ are, at each occurrence, independently a hydroxyl group, an alkoxy group, an amine group, a thiol group, an ester group, an melamine group, an alkene group, an alkyne group, an epoxy group, an aziridine group, an oxetane group, an aldehyde group, a ketone group, or a carboxylic acid group. In some embodiments, $X_1$ or $X_2$ is hydroxyl.

In some embodiments, at least one of $R_1$, $R_2$ and $R_3$ is H. In some embodiments, at least one of $R_1$, $R_2$ and $R_3$ is methyl. In some embodiments, $R_1$ is H, and $R_2$ or $R_3$ is methyl.

In some more specific embodiments, $L_1$ and $L_2$ are each independently fluoroalkylene, $L_3$ is a direct bond, and $Ar_1$ is phenylene, fluorophenylene, or fluoroalkyl phenylene. In some related embodiments, the polymer has the following structure (Ia):

(Ia)

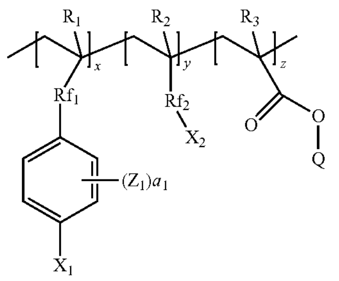

wherein:

$R_1$, $R_2$ and $R_3$ are, at each occurrence, independently H or alkyl;

$Rf_1$ and $Rf_2$ are, at each occurrence, independently fluoroalkylene;

$Z_1$ is, at each occurrence, independently F or fluoroalkyl;

Q is, at each occurrence, independently alkyl, cycloalkyl, hydroxyalkyl, alkoxy, alkoxyalkyl, adamantyl, cedryl, norbornyl, or tricyclodecanyl;

$X_1$ and $X_2$ are, at each occurrence, independently hydroxyl, epoxy, melamine alkene, or alkyne; and $a_1$ is, at each occurrence, an integer from 0 to 4.

In some more specific embodiments, $L_1$ and $L_3$ are a direct bond, $L_2$ is fluoroalkylene, $Ar_1$ is phenylene, fluorophenylene, or fluoroalkyl phenylene. In some related embodiments, the polymer has the following structure (Ib):

(Ib)

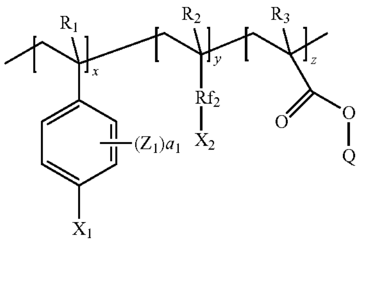

wherein:

$R_1$, $R_2$ and $R_3$ are, at each occurrence, independently H or alkyl;

$Rf_2$ is, at each occurrence, independently fluoroalkylene;

$Z_1$ is, at each occurrence, independently F or fluoroalkyl;

Q is, at each occurrence, independently alkyl, cycloalkyl, hydroxyalkyl, alkoxy, alkoxyalkyl, adamantyl, cedryl, norbornyl, or tricyclodecanyl;

$X_1$ and $X_2$ are, at each occurrence, independently hydroxyl, epoxy, melamine alkene, or alkyne; and $a_1$ is, at each occurrence, an integer from 0 to 4.

In some more specific embodiments, $L_1$ is fluoroalkylene, $L_3$ is a direct bond, $Ar_1$ is phenylene, fluorophenylene, or fluoroalkyl phenylene, and y is 0. In some related embodiments, the polymer has the following structure (Ic):

(Ic)

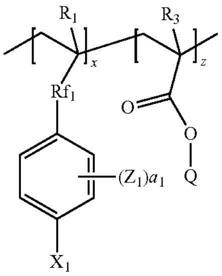

wherein:

$R_1$ and $R_3$ are, at each occurrence, independently H or alkyl;

$Rf_1$ is, at each occurrence, independently fluoroalkylene;

$Z_1$ is, at each occurrence, independently F or fluoroalkyl;

Q is, at each occurrence, independently alkyl, cycloalkyl, hydroxyalkyl, alkoxy, alkoxyalkyl, adamantyl, cedryl, norbornyl, or tricyclodecanyl;

$X_1$ is, at each occurrence, independently hydroxyl, epoxy, melamine alkene, or alkyne; and $a_1$ is, at each occurrence, an integer from 0 to 4.

In some embodiments, the polymer of the present disclosure has the following structure (II):

(II)

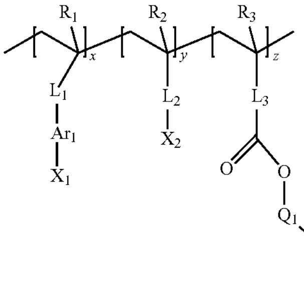

wherein $L_1$, $L_2$ and $L_3$ are, at each occurrence, independently a direct bond or a linker selected from an oxy (—O—) group, a carboxyl (—C(═O)—) group, a carbonyloxy (—C(═O)—O—) group, a oxycarbonyl (—O—C(═O)—) group, a carbonate (—O—C(═O)—O—) group, a halogenated or non-halogenated alkylene group, a halogenated or non-halogenated cycloalkylene group, a halogenated or non-halogenated oxyalkylene (—O-alkylene) group, a halogenated or non-halogenated oxycycloalkylene (—O-cycloalkylene) group, a halogenated or non-halogenated carbonyloxyalkylene (—C(═O)—O-alkylene) group, a halogenated or non-halogenated heteroalkylene group, or a halogenated or non-halogenated cycloheteroalkylene group.

$Ar_1$ and $Ar_2$ are, at each occurrence, independently a halogenated or non-halogenated arylene group or a halogenated or non-halogenated heteroarylene group.

$Q_1$ is, at occurrence, independently an acid labile group.

$X_1$, $X_2$, and $X_2$ are, at each occurrence, independently a reactive group, or protected form thereof, capable of forming a covalent bond with a crosslinker.

$R_1$, $R_2$ and $R_3$ are, at each occurrence, independently H, alkyl or alkoxy.

x and z are independently an integer of one or greater, and y is an integer of zero or greater. A portion of x, y and z in the polymer is $0<x/(x+y+z)<1$, $0\leq y/(x+y+z)<1$ and $0<z/(x+y+z)<1$.

In structure (II), at least one of $L_1$, $L_2$, $L_3$, $Ar_1$ or $Ar_2$ is halogenated. In some embodiments, at least one of $L_1$, $L_2$, $L_3$, $Ar_1$ or $Ar_2$ is fluorinated.

In some embodiments, $Q_1$ is, at each occurrence, independently an alkylene group, a cycloalkylene group, a hydroxyalkylene group, an alkoxy alkylene group, or a three-dimensional (3D) ring structure. In some embodiments, the 3D ring structure is an adamantylene, cedrylene, norbornylene, or tricyclodecanylene structure. In some embodiments, $Q_1$ has one of the following structures:

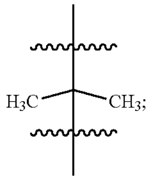

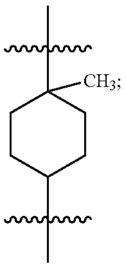

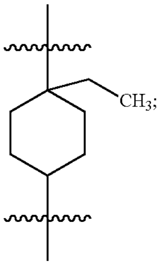

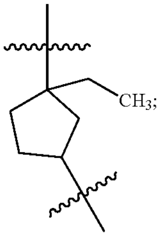

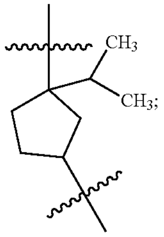

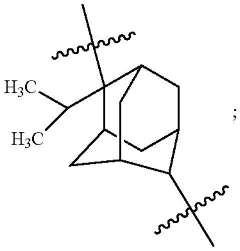

;

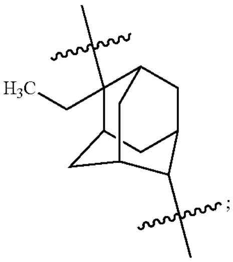

;

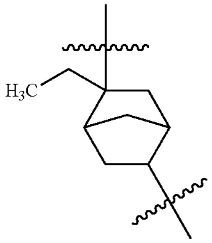

or

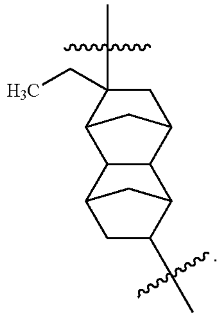

.

In some embodiments, $X_1$, $X_2$ and $X_3$ are, at each occurrence, independently a hydroxyl group, an alkoxy group, an amine group, a thiol group, an ester group, an melamine group, an alkene group, an alkyne group, an epoxy group, an aziridine group, an oxetane group, an aldehyde group, a ketone group, or a carboxylic acid group. In some embodiments, $X_1$ or $X_2$ is hydroxyl.

In some embodiments, $Ar_1$ and $Ar_2$ each have one of the following structures:

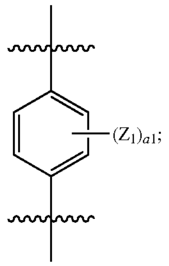

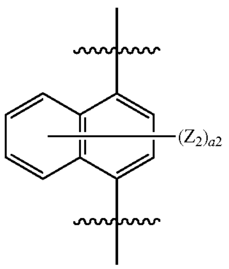

or

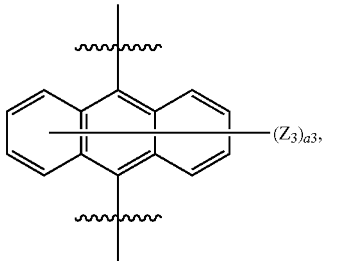

wherein:

- $Z_1$, $Z_2$ and $Z_3$ are, at each occurrence, independently F or fluoroalkyl;
- $a_1$ is an integer from 0 to 4;
- $a_2$ is an integer from 0 to 6; and
- $a_3$ is an integer from 0 to 8.

In some embodiments, $Ar_1$ and $Ar_2$ each have has one of the following structures:

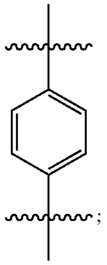

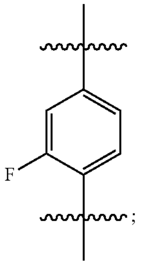

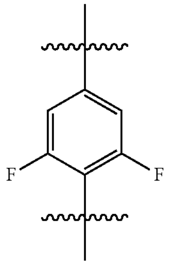

or

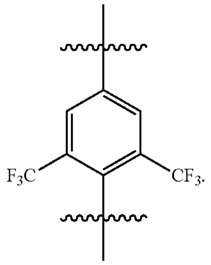

In some more specific embodiments, $L_1$ and $L_2$ are each independently fluoroalkylene, $L_3$ is a direct bond, and $Ar_1$ and $Ar_2$ are each independently phenylene, fluorophenylene, or fluoroalkyl phenylene. In some related embodiments, the polymer has the following structure (IIa):

(IIa)

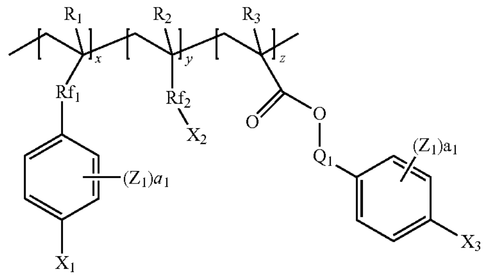

wherein:

- $R_1$, $R_2$ and $R_3$ are, at each occurrence, independently H or alkyl;
- $Rf_1$ and $Rf_2$ are, at each occurrence, independently fluoroalkylene;
- $Z_1$ is, at each occurrence, independently F or fluoroalkyl;
- $Q_1$ is, at each occurrence, independently alkylene, cycloalkylene, hydroxyalkylene, alkoxyalkylene, adamantylene, cedrylene, norbornylene, or tricyclodecanylene;
- $X_1$, $X_2$ and $X_3$ are, at each occurrence, independently hydroxyl, epoxy, melamine alkene, or alkyne; and
- $a_1$ is, at each occurrence, an integer from 0 to 4.

In some more specific embodiments, $L_1$ is fluoroalkylene, $L_3$ is a direct bond, $Ar_1$ and $Ar_2$ are each independently phenylene, fluorophenylene, or fluoroalkyl phenylene, and y and is 0. In some embodiments, the polymer has the following structure (IIb):

(IIb)

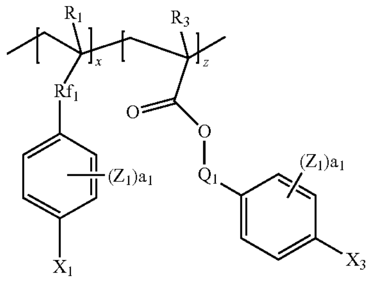

wherein:

- $Rf_1$ is, at each occurrence, independently fluoroalkylene;
- $Z_1$ is, at each occurrence, independently F or fluoroalkyl;
- $Q_1$ is, at each occurrence, independently alkylene, cycloalkylene, hydroxyalkylene, alkoxy alkylene, adamantylene, cedrylene, norbornylene, or tricyclodecanylene;
- $X_1$ and $X_3$ are, at each occurrence, independently hydroxyl, epoxy, melamine alkene, or alkyne; and
- $a_1$ is, at each occurrence, an integer from 0 to 4.

In some embodiments, the polymer of the present disclosure has the following structure (III):

(III)

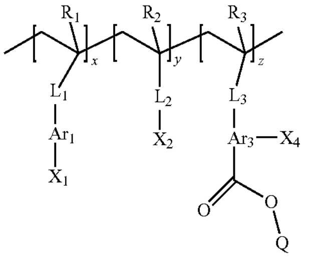

wherein $L_1$, $L_2$ and $L_3$ are, at each occurrence, independently a direct bond or a linker selected from an oxy (—O—) group, a carboxyl (—C(═O)—) group, a carbonyloxy (—C(═O)—O—) group, a oxycarbonyl (—O—C(═O)—) group, a carbonate (—O—C(═O)—O—) group, a halogenated or non-halogenated alkylene group, a halogenated or non-halogenated cycloalkylene group, a halogenated or non-halogenated oxyalkylene (—O-alkylene) group, a halogenated or non-halogenated oxycycloalkylene (—O-cycloalkylene) group, a halogenated or non-halogenated carbonyloxyalkylene (—C(═O)—O-alkylene) group, a halogenated or non-halogenated heteroalkylene group, or a halogenated or non-halogenated cycloheteroalkylene group.

$Ar_1$ and $Ar_3$ is, at each occurrence, a halogenated or non-halogenated arylene group or a halogenated or non-halogenated heteroarylene group.

Q is, at occurrence, independently an acid labile group.

$X_1$, $X_2$ and $X_4$ are, at each occurrence, independently a reactive group, or protected form thereof, capable of forming a covalent bond with a crosslinker.

$R_1$, $R_2$ and $R_3$ are, at each occurrence, independently H, alkyl or alkoxy.

x and z are independently an integer of one or greater, and y is an integer of zero or greater. A portion of x, y and z in the polymer is $0<x/(x+y+z)<1$, $0\leq y/(x+y+z)<1$ and $0<z/(x+y+z)<1$.

In structure (III), at least one occurrence of $L_1$, $L_2$, $Ar_1$ or $Ar_3$ is halogenated. In some embodiments, at least one occurrence of $L_1$, $L_2$, $Ar_1$ or $Ar_3$ is fluorinated.

In some embodiments, $X_1$, $X_2$ and $X_4$ are, at each occurrence, independently a hydroxyl group, an alkoxy group, an amine group, a thiol group, an ester group, an melamine group, an alkene group, an alkyne group, an epoxy group, an aziridine group, an oxetane group, an aldehyde group, a ketone group, or a carboxylic acid group. In some embodiments, $X_1$ or $X_2$ is hydroxyl.

In some embodiments, $Ar_1$ and $Ar_3$ each have one of the following structures:

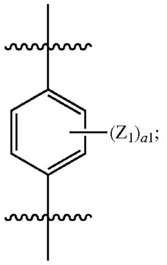

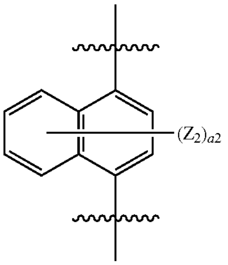

or

-continued

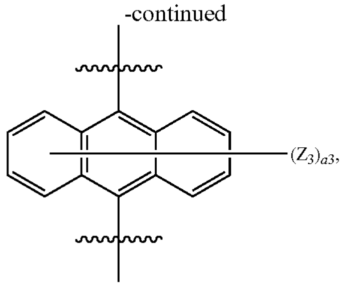

wherein:

$Z_1$, $Z_2$ and $Z_3$ are, at each occurrence, independently F or fluoroalkyl;

$a_1$ is an integer from 0 to 4;

$a_2$ is an integer from 0 to 6; and $a_3$ is an integer from 0 to 8.

In some embodiments, $Ar_1$ and $Ar_3$ each have has one of the following structures:

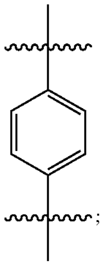

;

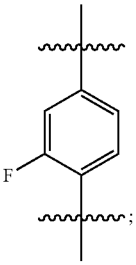

;

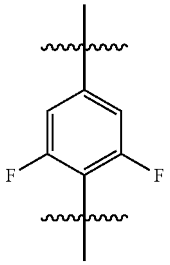

or

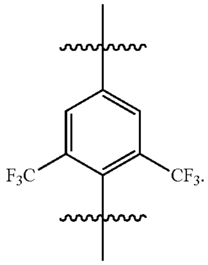

.

In some more specific embodiments, $L_1$ and $L_2$ are each independently fluoroalkylene, $L_3$ is a direct bond, and $Ar_1$ and $Ar_3$ are each independently phenylene, fluorophenylene, or fluoroalkyl phenylene. In some related embodiments, the polymer has the following structure (IIIa):

(IIIa)

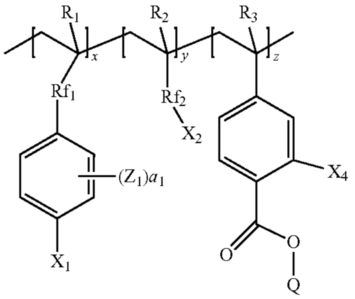

wherein:

$R_1$, $R_2$ and $R_3$ are, at each occurrence, independently H or alkyl;

$Rf_1$ and $Rf_2$ are, at each occurrence, independently fluoroalkylene;

$Z_1$ is, at each occurrence, independently F or fluoroalkyl;

Q is, at each occurrence, independently alkyl, cycloalkyl, hydroxyalkyl, alkoxy, alkoxyalkyl, adamantyl, cedryl, norbornyl, or tricyclodecanyl;

$X_1$, $X_2$ and $X_4$ are, at each occurrence, independently hydroxyl, epoxy, melamine alkene, or alkyne; and $a_1$ is, at each occurrence, an integer from 0 to 4.

In some more specific embodiments, $L_1$ and $L_3$ are each independently fluoroalkylene, $Ar_1$ and $Ar_3$ are each independently phenylene, fluorophenylene, or fluoroalkyl phenylene, and y is 0. In some related embodiments, the polymer has the following structure (IIIb):

(IIIb)

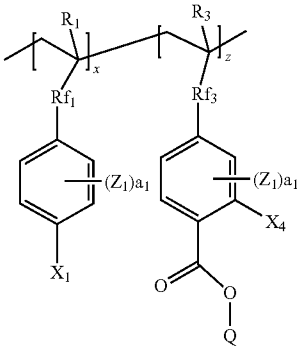

wherein:

$R_1$ and $R_3$ are, at each occurrence, independently H or alkyl;

$Rf_1$ and $Rf_3$ are, at each occurrence, independently fluoroalkylene;

$Z_1$ is, at each occurrence, independently F or fluoroalkyl;

Q is, at each occurrence, independently alkyl, cycloalkyl, hydroxyalkyl, alkoxy, alkoxyalkyl, adamantyl, cedryl, norbornyl, or tricyclodecanyl;

$X_1$ and $X_4$ are, at each occurrence, independently hydroxyl, epoxy, melamine alkene, or alkyne; and $a_1$ is, at each occurrence, an integer from 0 to 4.

In some specific embodiments, the polymer of structure (I)-(III) is a compound selected from Table 1.

TABLE 1

| Exemplary Compound of Structure (I)-(III) | |
|---|---|
| No. | Structure |
| I-1 | 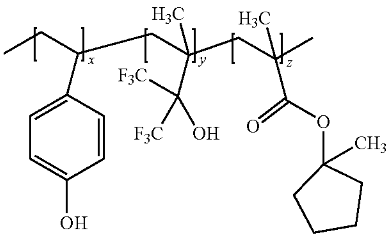 |

TABLE 1-continued

| Exemplary Compound of Structure (I)-(III) | |
|---|---|
| No. | Structure |
| I-2 | 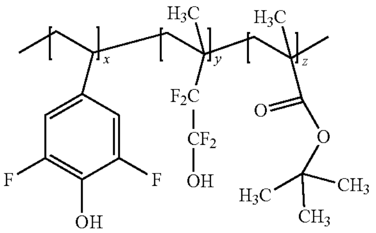 |
| I-3 | 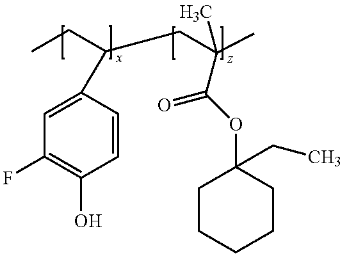 |
| I-4 | 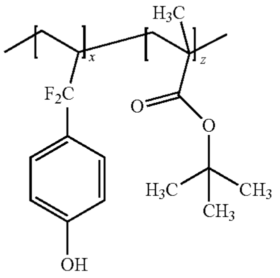 |
| I-5 | 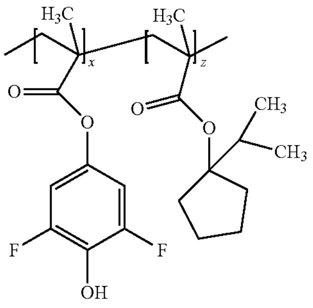 |
| I-6 | 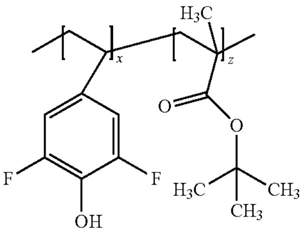 |

TABLE 1-continued

| Exemplary Compound of Structure (I)-(III) | |
|---|---|
| No. | Structure |
| I-7 | 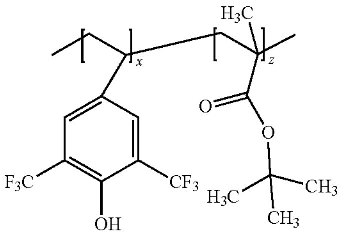 |
| II-1 | 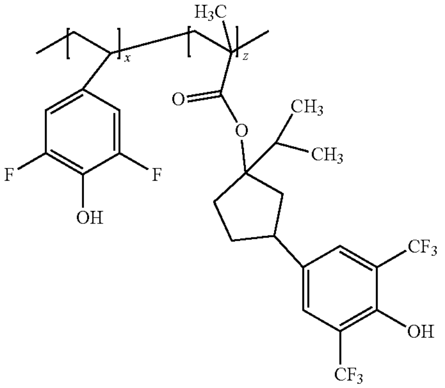 |
| III-1 | 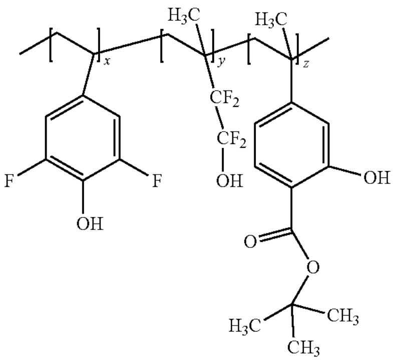 |

In some embodiments, the crosslinker in the photoresist composition is a separate component and not attached to the polymer before the polymer undergoes crosslinking. The crosslinker contains crosslinking groups that can react with the reactive groups from the polymer, thereby crosslinking the polymer. The crosslinking increases the molecular weight, and therefore the glass transition temperature of the polymer. Such increase in the glass transition temperature helps to restrict the acid diffusion length, which leads to the reduced line width roughness (LWR).

Figure 3:
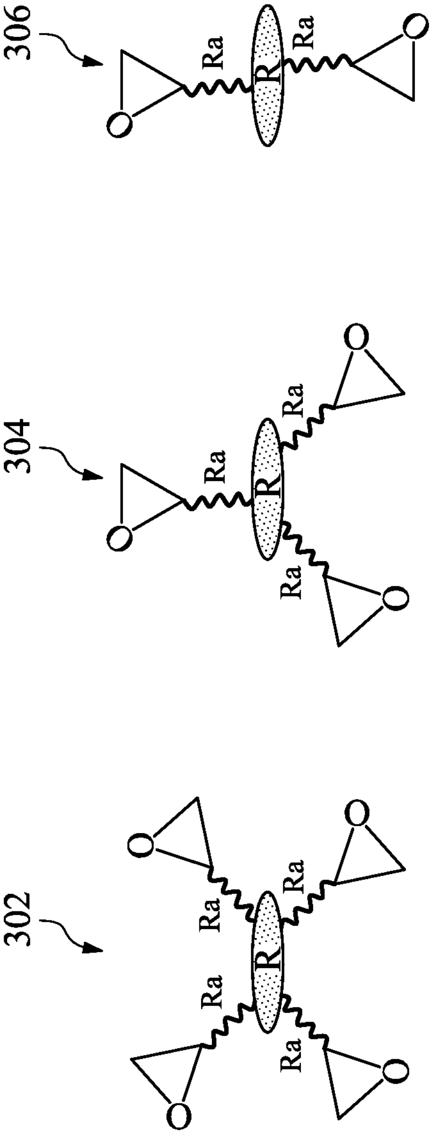
FIG. 3 illustrates examples of crosslinkers having epoxy groups according to some embodiments of the present disclosure.

FIGS. 3-6 illustrate examples of the crosslinker that can be used in the present disclosure. The crosslinker may include two or more crosslinking sites. FIG. 3 illustrates crosslinkers 302, 304, and 306 that contain epoxy groups as the crosslinking sites attached to a core group R. R may include alkylene, haloalkylene, cycloalkylene, heteroalkylene, haloheteroalkylene, cycloheteroalkylene, arylene, haloarylene, or haloheteroarylene. The crosslinker 302 may contain four crosslinking sites, the crosslinker 304 may contain three crosslinking sites, and the crosslinker 306 may contain two crosslinking sites. Ra in the crosslinkers 302, 304, and 306 may be an alkyl group, a cycloalkyl group, a hydroxylalkyl group, a cycloalkyl carboxyl group, or a heterocyclic group. The Ra chain may be rotatable to achieve a high crosslinking reaction efficiency in the exposed areas of the photoresist layer 220.

Figure 4:
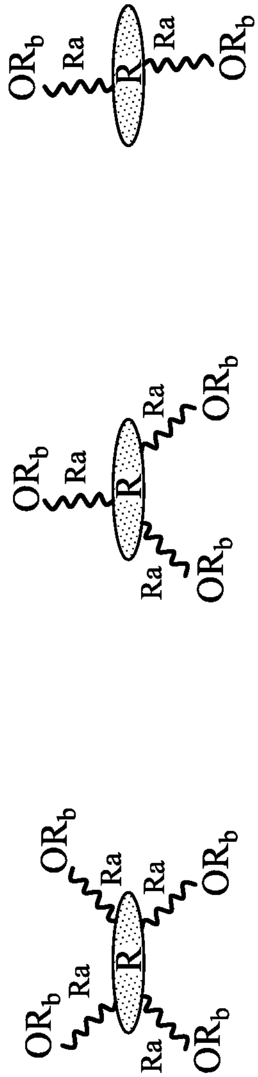
FIG. 4 illustrates examples of crosslinkers having hydroxyl groups according to some embodiments of the present disclosure.

FIG. 4 illustrates crosslinkers 402, 404, and 406 that contain hydroxyl groups as the crosslinking sites attached to a core group R. R may include alkylene, haloalkylene, cycloalkylene, heteroalkylene, haloheteroalkylene, cycloheteroalkylene, arylene, haloarylene, or haloheteroarylene. The crosslinker 402 may contain four crosslinking sites, the crosslinker 404 may contain three crosslinking sites, and the crosslinker 406 may contain two crosslinking sites. Ra in the crosslinkers 402, 404, and 406 may be an alkylene group, a cycloalkylene group, a hydroxylalkylene group, a carboxyl cycloalkylene group, or a heterocyclic group. The Ra chain may be rotatable to achieve a high crosslinking reaction efficiency in the exposed areas of the photoresist layer 220. The Ra chain may be rotatable to achieve a high cross-link reaction efficiency in the exposed areas of the photoresist layer 220. Rb in the crosslinkers 402, 404, and 406 may be hydrogen (H) or an alkyl group, a cycloalkyl group, a hydroxylalkyl group, a cycloalkyl carboxyl group, or a heterocyclic group.

Figure 5:
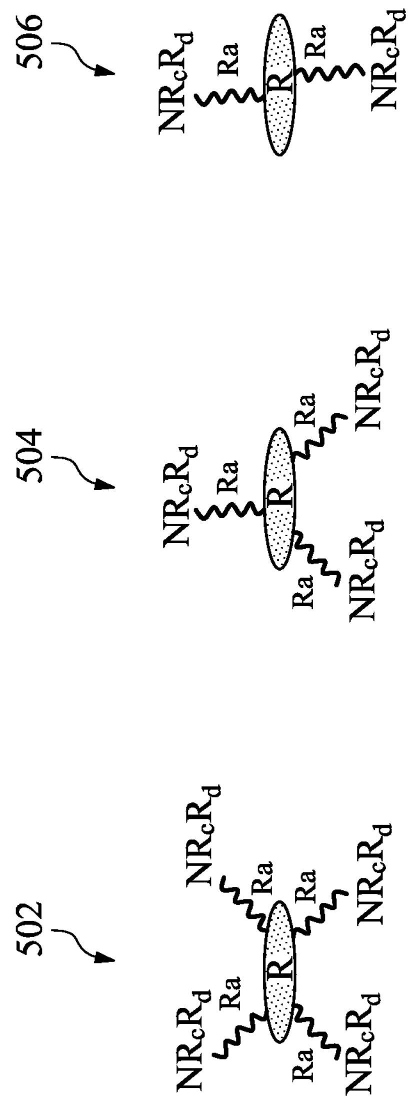
FIG. 5 illustrates examples of crosslinkers having melamine groups according to some embodiments of the present disclosure.

FIG. 5 illustrates crosslinkers 502, 504, and 506 that contain melamine groups as the crosslinking sites attached to a core group R. R may include alkylene, haloalkylene, cycloalkylene, heteroalkylene, haloheteroalkylene, cycloheteroalkylene, arylene, haloarylene, or haloheteroarylene. The crosslinker 502 may contain four crosslinking sites, the crosslinker 504 may contain three crosslinking sites, and the crosslinker 506 may contain two crosslinking sites. Ra in the crosslinkers 502, 504, and 506 may be an alkylene group, a cycloalkylene group, a hydroxylalkylene group, a carboxyl cycloalkylene group, or a heterocyclic group. The Ra chain may be rotatable to achieve a high crosslinking reaction efficiency in the exposed areas of the photoresist layer 220. The Ra chain may be rotatable to achieve a high cross-link reaction efficiency in the exposed areas of the photoresist layer 220. Rd and Rc in the crosslinkers 502, 504, and 506 may be independently hydrogen (H) or an alkyl group, a cycloalkyl group, a hydroxylalkyl group, a cycloalkyl carboxyl group, or a heterocyclic group.

Figure 6:
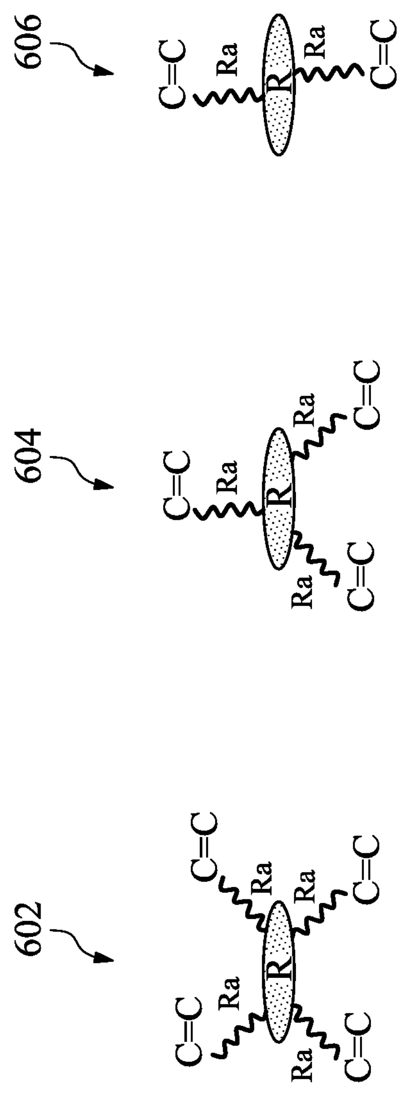
FIG. 6 illustrates examples of crosslinkers having alkene groups according to some embodiments of the present disclosure.

FIG. 6 illustrates crosslinkers 602, 604, and 606 that contain alkene groups as the crosslinking sites attached to a core group R. R may include alkylene, haloalkylene, cycloalkylene, heteroalkylene, haloheteroalkylene, cycloheteroalkylene, arylene, haloarylene, or haloheteroarylene. The crosslinker 602 may contain four crosslinking sites, the crosslinker 604 may contain three crosslinking sites, and the crosslinker 606 may contain two crosslinking sites. Ra in the crosslinkers 602, 604, and 606 may be an alkylene group, a cycloalkylene group, a hydroxylalkylene group, a carboxyl cycloalkylene group, or a heterocyclic group. The Ra chain may be rotatable to achieve a high crosslinking reaction efficiency in the exposed areas of the photoresist layer 220.

In some embodiments, the crosslinker has one of the following structures:

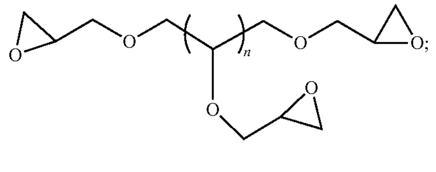

-continued

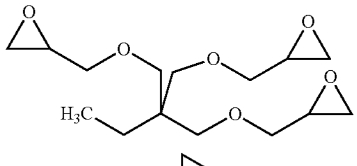
;

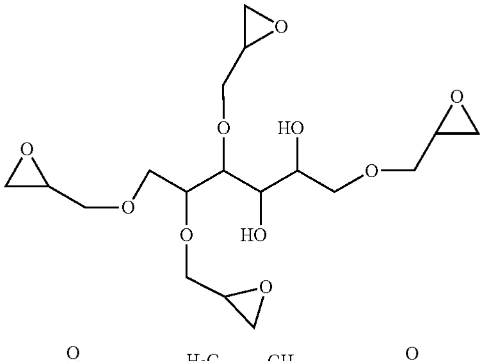
;

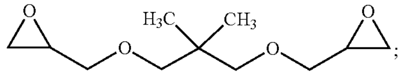
;

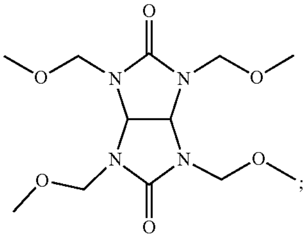
;

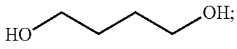
;

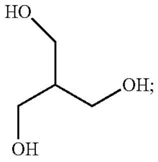
;

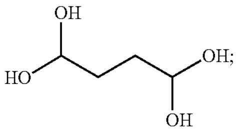
;

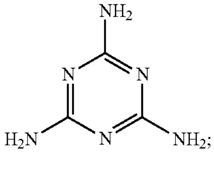
;

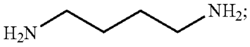
;

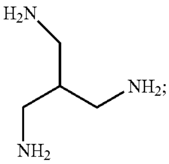
;

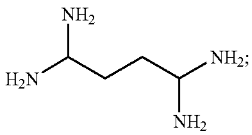
;

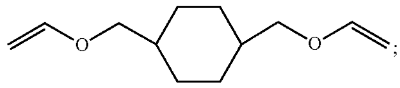
;

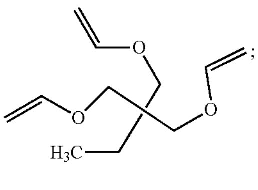
;

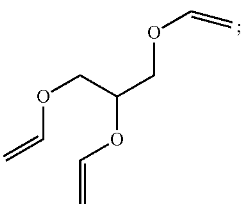
;

-continued

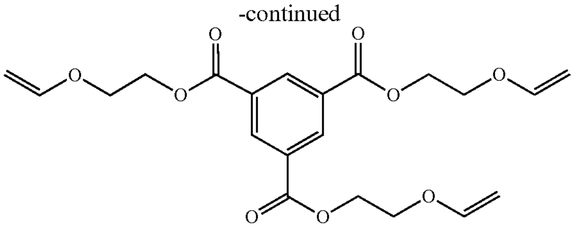

or

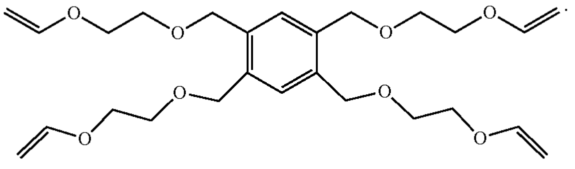
.

In some embodiments, the concentration of the crosslinker in the photoresist composition ranges from about 0.1 wt. % to about 50 wt. % based on the total weight of the polymer taken as 100%. In some other embodiments, the concentration of the crosslinker in the photoresist composition ranges from about 5 wt. % to about 20 wt. % based on the total weight of crosslinker and the polymer. Photoresist compositions having less than about 0.1 wt. % of the crosslinker may undergo insufficient crosslinking during photoresist patterning. Photoresist compositions having more than 50 wt. % of the crosslinker may result in reduced photoresist pattern resolution or increased line width roughness (LWR).

In some embodiments, the PACs in the photoresist composition include photoacid generators, photobase generators, photo decomposable bases, free-radical generators, or the like. In some embodiments in which the PACs are photoacid generators, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments, the PACs include photobase generators (PBG) and photo decomposable bases (PDB). In embodiments in which the PACs are photobase generators (PBG), the PBGs include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, combinations of these, or the like.

In some embodiments in which the PACs are photo decomposable bases (PDB), the PDBs include triphenylsulfonium hydroxide, triphenylsulfonium antimony hexafluoride, and triphenylsulfonium triflyl.

The photoresist composition may include PACs from about 0.1 wt. % to 10 wt. % based upon the total weight of the polymer taken as 100%. In some embodiments, the photoresist composition includes PACs from about 1 wt. % to about 5 wt. %. Photoresist compositions having less than about 0.01 wt. % of PACs may results in low rates of crosslinking reaction. Photoresist compositions having more than 10 wt. % of the PACs may result in reduced photoresist pattern resolution or increased line width roughness (LWR).

The photoresist composition may also include a number of other optional ingredients such as, for example, surfactants and adhesion promoters.

The solvent in the photoresist composition is suitable for dissolving, dispensing, and coating the components used in the photoresist composition. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

The amount of solvent in the photoresist compositing may be from about 80 wt. % to about 99 wt. % by weight based upon the total weight of the composition as 100%. In some embodiments, the amount of solvent in the photoresist compositing may be from about 95 wt. % to about 99 wt. %.

The photoresist composition is prepared by dispersing or dissolving various components including polymer, cross-linker and PACs into the solvent to form a homogenous solution. The photoresist composition is then applied to the surface of the material layer 210 to form the photoresist layer 220.

Applying may be accomplished by any suitable method, including spin coating, spray coating, dip coating, doctor blading, or the like. In some embodiments, applying the photoresist composition is accomplished using a coating track, in which the photoresist composition is dispensed on the spinning substrate 202. During dispense, the substrate 202 may be spun at a speed of up to 4,000 rpm, preferably from 500 to 3,000 rpm, and more preferably 1,000 to 2,500 rpm.

Figure 2C:
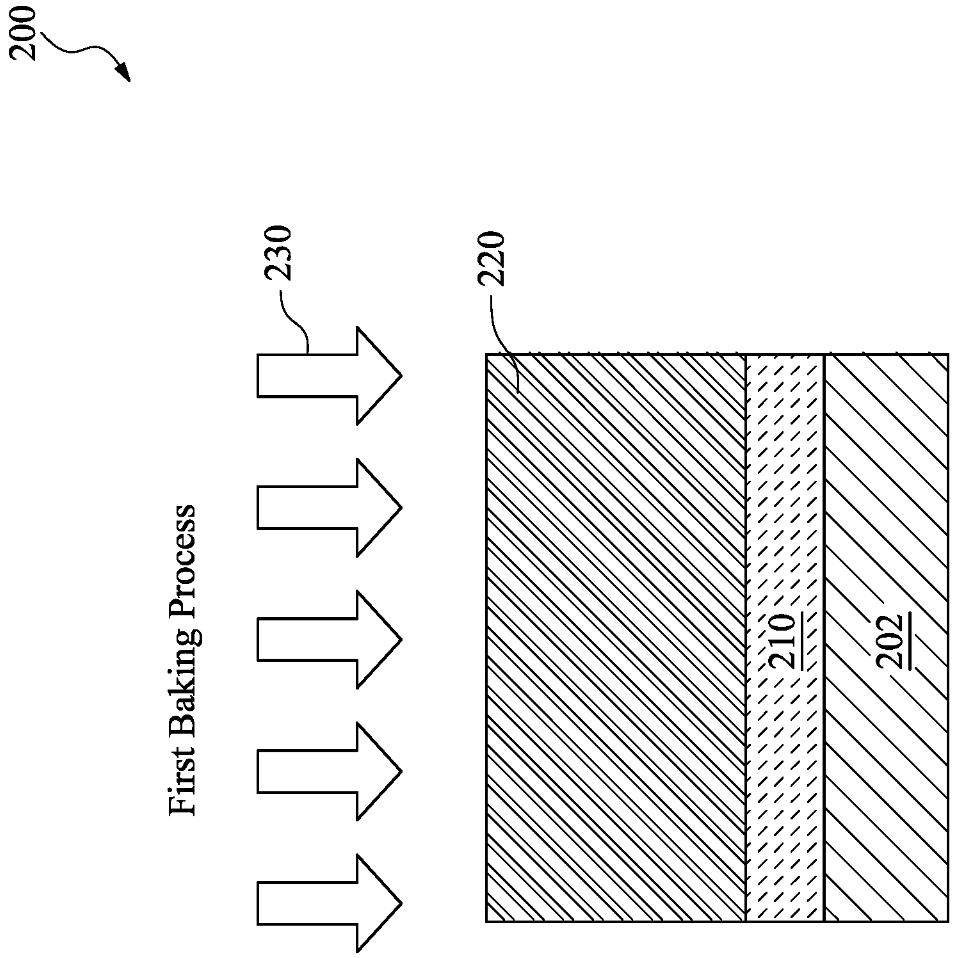

Referring to FIGS. 1 and 2C, the method 100 proceeds to operation 106, in which a first baking process 230 is performed to the photoresist layer 220, in accordance with some embodiments. FIG. 2C is a cross-sectional view of the semiconductor device 200 of FIG. 2B after performing the first baking process 230 to the photoresist layer 220, in accordance with some embodiments.

Since this first baking process 230 is performed to cure and dry the photoresist layer 220 before exposing the photoresist layer 220 to radiation, the first baking process 230 may also be referred to as a pre-exposure-baking process. The curing and drying of the photoresist layer 220 removes the residue solvent and free volume from the film to make the photoresist layer 220 uniformly dense. In some embodiments, the first baking process 230 is performed at a temperature suitable to evaporate the solvent, such as from about 40° C. to about 120° C. The first baking process 230 is performed for a time sufficient to cure and dry the photoresist layer 220, such as for about 10 seconds to about 10 minutes.

Figure 2D:
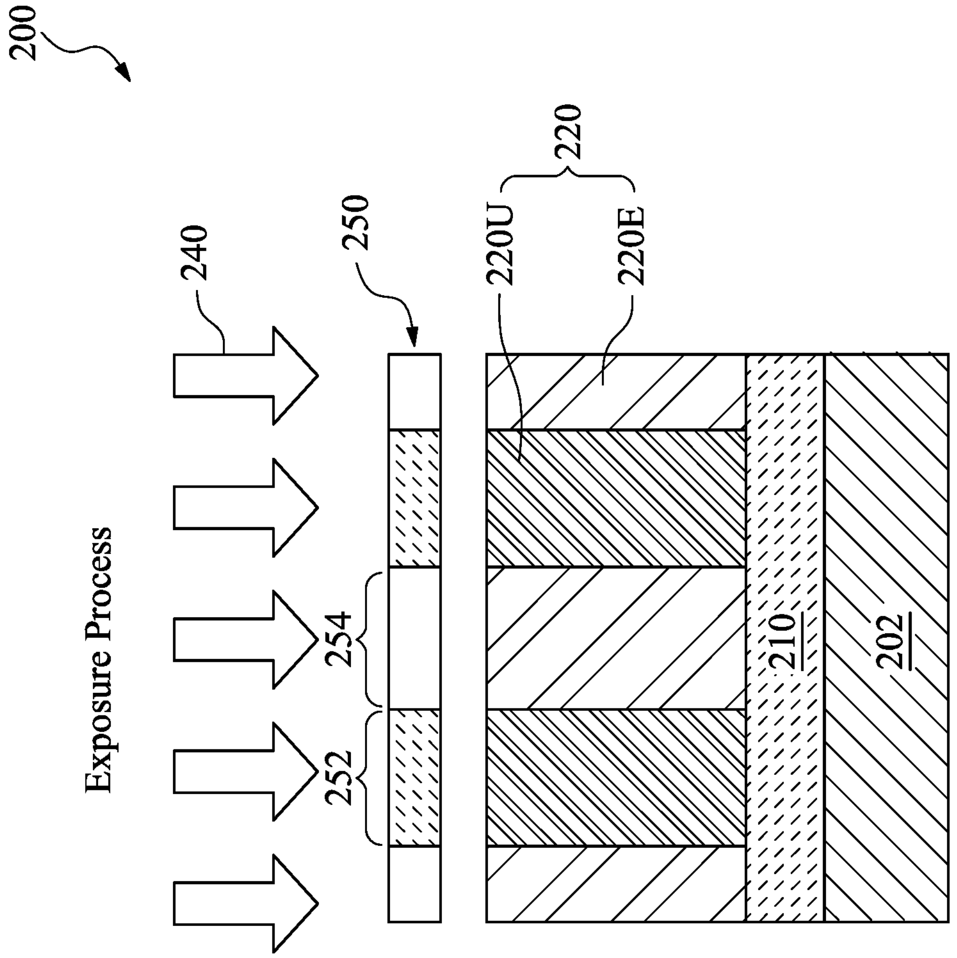

Referring to FIGS. 1 and 2D, the method 100 proceeds to operation 108, in which an exposure process 240 is performed to the photoresist layer 220, in accordance with some embodiments. FIG. 2D is a cross-sectional view of the semiconductor device 200 of FIG. 2C after performing the exposure process 240 to the photoresist layer 220, in accordance with some embodiments.

During the exposure process 240, the photoresist layer 220 is exposed to a radiation from a light source through a photomask 250. In some embodiments, the photomask 250 is a transmissive mask. In some other embodiments, the photomask 250 is a reflective mask. The photomask 250 has a predefined pattern designed for an IC, based on a specification of the IC to be manufactured. The patterns of the photomask 250 correspond to patterns of materials that make up the various components of the IC device to be fabricated. For example, a portion of the IC design layout includes various IC features, such as an active region, gate electrode, source and drain, metal lines or vias of an interlayer interconnection, and openings for bonding pads, to be formed in the substrate 202 and/or the material layer 210 disposed on the substrate 202.

In some embodiments, the photomask 250 includes first regions 252 and second regions 254. In the first regions 252, the radiation is blocked by the photomask 250 to reach the photoresist layer 220, while in the second regions 254, the radiation is not blocked by the photomask 250 and can pass through the photomask 250 to reach the photoresist layer 220. As a result, portions of the photoresist layer 220 below the second regions 254 receive the radiation, referred to as exposed regions 220E, while portions of the photoresist layer 220 below the first regions 252 do not receive the radiation, referred to as unexposed regions 220U.

In some embodiments, the radiation is an EUV radiation (e.g., 13.5 nm). Alternatively, in some embodiments, the patterning radiation is a DUV radiation (e.g., from a 248 nm KrF excimer laser or a 193 nm ArF excimer laser), an X-ray radiation, an e-beam radiation, an ion beam radiation, or other suitable radiations. In some embodiments, the exposure process 240 is performed in a liquid (immersion lithography) or in a vacuum (e.g., for EUV lithography and e-beam lithography).

Upon exposure to the radiation, the PACs in the exposed regions 220E of the photoresist layer 220 absorb the radiation and generate an acid, a base, or a free radical depending on the type of PACs being used. The generated acid/base/free radical decomposes the acid labile group Q in the polymer sidechain and generates a hydroxyl group. The generated acid/base/free radical also catalyzes a crosslinking reaction between the de-protected polymer and crosslinker to form a crosslinked polymer in the exposed regions 220E of the photoresist layer 220. The crosslinking increases the molecular weight of the polymer in the exposed regions 220E. By increasing the molecular weight of the polymer through the crosslinking reaction, the exposed regions 220E of the photoresist layer 220 become less soluble in a developer than the unexposed regions 220U of the photoresist layer 220.

Figure 2E:
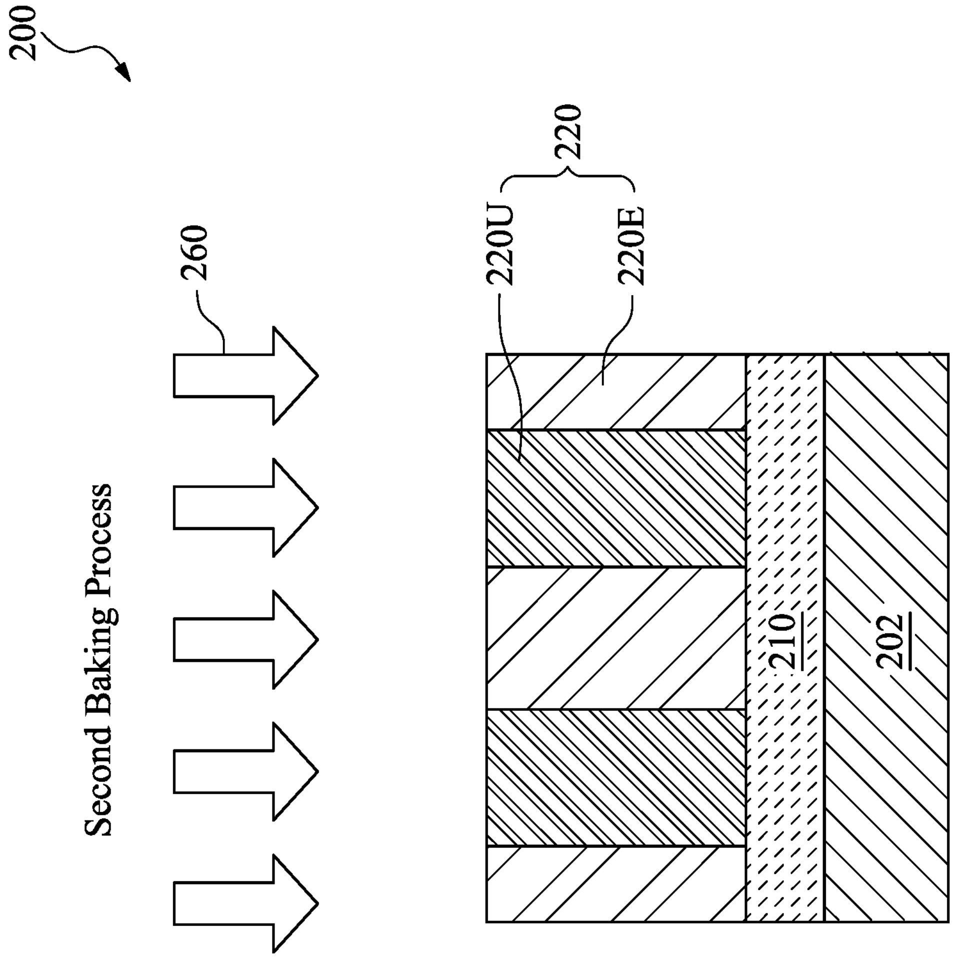

Referring to FIGS. 1 and 2E, the method 100 proceeds to operation 110, in which a second baking process 260 is performed to the photoresist layer 220, in accordance with some embodiments. FIG. 2E is a cross-sectional view of the semiconductor device 200 of FIG. 2D after performing the second baking process 260, in accordance with some embodiments.

Since the second baking process 260 is performed after the exposure process 240 that exposes the photoresist layer 220 to radiation, the second baking process 260 may also be referred to as a post-exposure-baking (PEB) process. The second baking process 260 helps to assist in the dispersing and reacting of the acid/base/free radical generated from the impingement of the radiation upon the PACs during the exposure. Such thermal assistance facilitates the crosslinking reaction, and thus helps to further increase the crosslinking density and the molecular weight of the crosslinked polymer in the exposed regions 220E of the photoresist layer 220. The increased molecular weight results in a further increase in the ($T_g$) of the polymer. The high glass transition temperature arose from using halogenated units and crosslinking allows effectively suppress the acid diffusion length during the photoresist lithography process, which helps to reduce line width roughness (LWR) of the resist pattern.

In some embodiments, the second baking process 260 is performed at temperatures ranging from about 50° C. to about 160° C. for a period of from about 20 seconds to about 120 seconds. In some embodiments, the second baking process is performed at a temperature ranging from about 80° C. to about 100° C.

Figure 2F:
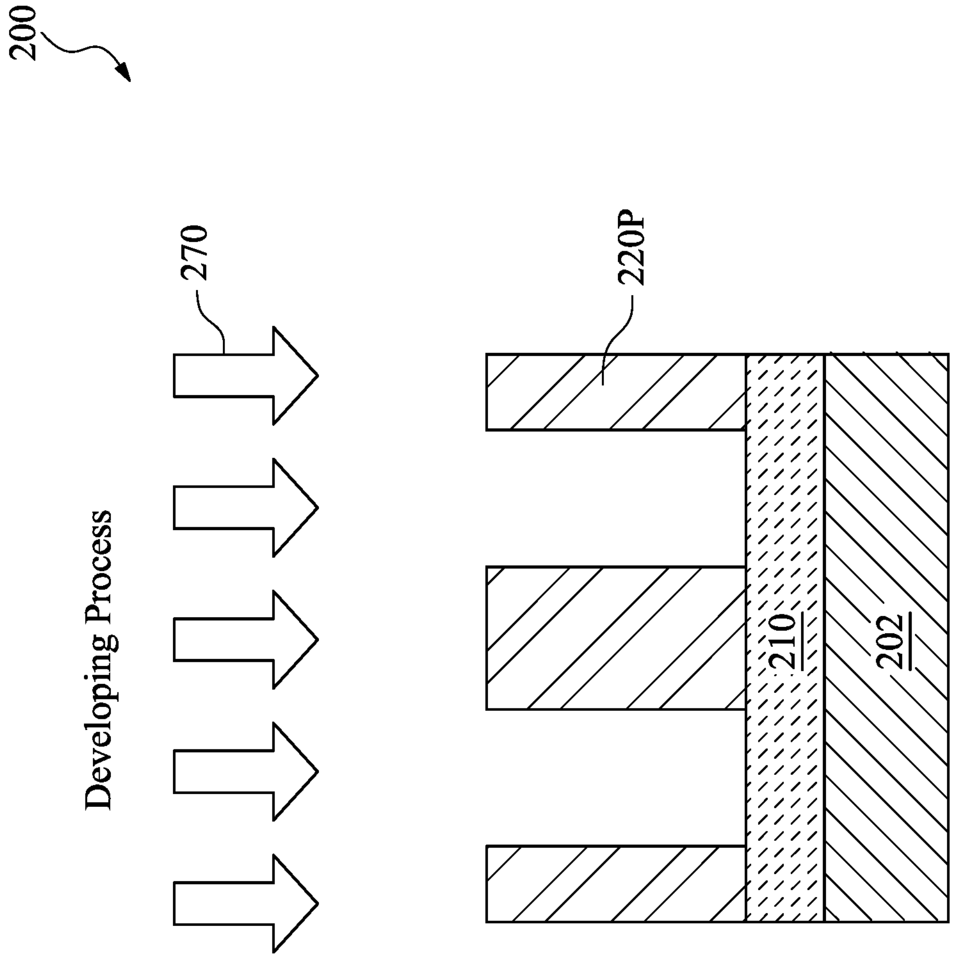

Referring to FIGS. 1 and 2F, the method 100 proceeds to operation 112, in which a developing process 270 is performed to the photoresist layer 220, in accordance with some embodiments. FIG. 2F is a cross-sectional view of the semiconductor device 200 of FIG. 2E after performing the developing process 270 to the photoresist layer 220, in accordance with some embodiments.

The developing process 270 includes applying a developer to the photoresist layer 220. The developer dissolves the unexposed regions 220U of the photoresist layer 220, exposing the surface of the material layer 210 and leaving the well-defined exposed regions 220E having improved definition than provided by conventional photoresist lithography.

After the developing process, a patterned photoresist layer 220P is formed. The patterned photoresist layer 220P includes the exposed regions 220E of the photoresist layer 220.

In some embodiments, the developer includes a solvent, and an acid or a base. In some embodiments, the concentration of the solvent in the developer is from about 60 wt. % to about 99 wt. % based on the total weight of the developer. The acid or base concentration is from about 0.001 wt. % to about 20 wt. % based on the total weight of the developer. In certain embodiments, the acid or base concentration in the developer is from about 0.01 wt. % to about 15 wt. % based on the total weight of the developer. In some embodiments, the developer is an aqueous-based developer, such as a tetramethylammonium hydroxide (TMAH) solution. In some embodiments the developer includes an organic solvent. In some embodiments, the developer is 2-heptanone or a butyl acetate such as n-butyl acetate.

In some embodiments, the developer is applied to the photoresist layer 220 using a spin coating process. In the spin coating process, the developer is applied to the photoresist layer 220 by a dispenser from above while the coated substrate 202 is rotated. In some embodiments, the developer is supplied at a rate of between about 5 ml/min and about 800 ml/min, while the coated substrate 202 is rotated at a speed of between about 100 rpm and about 2000 rpm. In some embodiments, the developer is at a temperature from about 10° C. to about 80° C. The development operation continues for between about 30 seconds to about 10 minutes in some embodiments.

While the spin coating operation is one suitable method for developing the photoresist layer 220 after exposure, it is intended to be illustrative and is not intended to limit the embodiment. Rather, any suitable development operations, including dip processes, puddle processes, and spray-on methods, may alternatively be used. All such development operations are included within the scope of the embodiments.

Figure 2G:
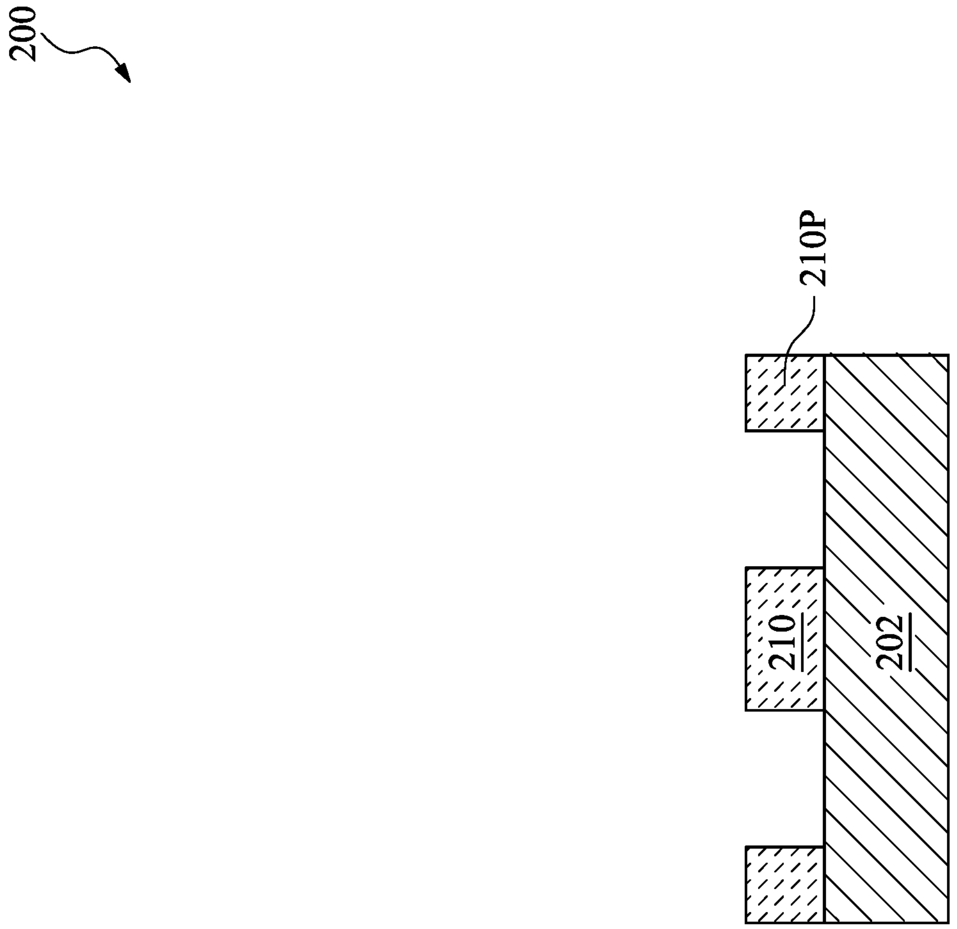

Referring to FIGS. 1 and 2G, the method 100 proceeds to operation 114, in which the material layer 210 is etched using the patterned photoresist layer 220P as an etch mask, in accordance with some embodiments. FIG. 2G is a cross-sectional view of the semiconductor device 200 of FIG. 2F after etching the material layer 210 using the patterned photoresist layer 220P as an etch mask, in accordance with some embodiments.

As shown in FIG. 2G, the material layer 210 is patterned, using the patterned photoresist layer 220P as an etch mask, to form a patterned material layer 210*p*.

An etching process may be performed to transfer the pattern in the patterned photoresist layer 220P to the material layer 210. In some embodiments, the etching process employed is an anisotropic etch such as a dry etch although any suitable etch process may be utilized. In some embodiments, the dry etch is a reactive ion etch (RIE) or a plasma etch. In some embodiments, the dry etch is implemented by fluorine-containing gas (e.g., $CF_4$, $SF_6$, $CH_2F_2$, $CHF_3$, and/ or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. In some embodiments, an oxygen plasma is performed to etch the material layer 210. In some embodiments, the anisotropic etch is performed at a temperature from about 250° C. to 450° C. for a duration from about 20 seconds to about 300 seconds.

If not completely consumed in the etching process, after formation of the patterned material layer 210*p*, the patterned photoresist layer 220P is removed, for example, by plasma ashing or wet stripping.

By incorporating halogenated functional groups into the polymer sidechain in combination with crosslinking of the polymer so as to increase the glass transition temperature ($T_g$) of a photosensitive polymer, the photoresist compositions of the present disclosure effectively suppress the acid diffusion length, which leads to improved line width roughness (LWR) and enhanced resolution capable of reaching sub 22-nm feature sizes. The photoresist compositions and methods according to the present disclosure thus provide improved semiconductor device feature resolution and density with reduced defects in a higher efficiency process.

One aspect of this description relates to a method for forming a semiconductor device. The method includes forming a photoresist layer comprising a polymer, a crosslinker and a photoactive compound over a substrate, exposing the photoresist layer to radiation to form a pattern therein, and selectively removing portions of the photoresist layer that are not exposed to the radiation to form a patterned photoresist layer. The polymer has the following structure (I).

(I)

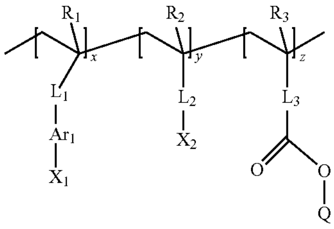

In structure (I), $L_1$, $L_2$ and $L_3$ are, at each occurrence, independently a direct bond or a linker selected from oxy, carboxyl, carbonyloxy, oxycarbonyl, carbonate, halogenated or non-halogenated alkylene, halogenated or non-halogenated cycloalkylene, halogenated or non-halogenated oxyalkylene, halogenated or non-halogenated oxycycloalkylene, halogenated or non-halogenated carbonyloxyalkylene, halogenated or non-halogenated heteroalkylene, or halogenated or non-halogenated cycloheteroalkylene. $Ar_1$ is, at each occurrence, independently halogenated or non-halogenated arylene or halogenated or non-halogenated heteroarylene. Q is, at occurrence, independently an acid labile group. $X_1$ and $X_2$ are, at each occurrence, independently a reactive group, or protected form thereof, capable of forming a covalent bond with the crosslinker. $R_1$, $R_2$ and $R_3$ are, at each occurrence, independently H, alkyl or alkoxy. A portion of x, y, and z in the polymer is $0<x/(x+y+z)<1$, $0\leq y/(x+y+z)<1$ and $0<z/(x+y+z)<1$. At least one of $L_1$, $L_2$ or $Ar_1$ is halogenated.

Another aspect of this description relates to a method for forming a semiconductor device. The method includes depositing a photoresist layer over a substrate, wherein the photoresist layer comprises a polymer, a crosslinker and a photoactive compound; exposing the photoresist layer to radiation; forming a crosslinked polymer in portions of the photoresist layer exposed to the radiation; and developing the photoresist layer to form a patterned photoresist layer. The polymer has the following structure (II):

(II)

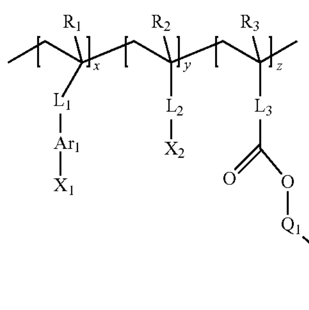

In structure (II), $L_1$, $L_2$ and $L_3$ are, at each occurrence, independently a direct bond or a linker selected from oxy, carboxyl, carbonyloxy, oxycarbonyl, carbonate, halogenated or non-halogenated alkylene, halogenated or non-halogenated cycloalkylene, halogenated or non-halogenated oxyalkylene, halogenated or non-halogenated oxycycloalkylene, halogenated or non-halogenated carbonyloxyalkylene, halogenated or non-halogenated heteroalkylene, or halogenated or non-halogenated cycloheteroalkylene. $Ar_1$ and $Ar_2$ are, at each occurrence, independently halogenated or non-halogenated arylene or halogenated or non-halogenated heteroarylene. $Q_1$ is, at occurrence, independently an acid labile group. $X_1$, $X_2$ and $X_3$ are, at each occurrence, independently a reactive group, or protected form thereof, capable of forming a covalent bond with the crosslinker. $R_1$, $R_2$ and $R_3$ are, at each occurrence, independently H, alkyl or alkoxy. A portion of x, y and z in the polymer is $0<x/(x+y+z)<1$, $0\leq y/(x+y+z)<1$ and $0<z/(x+y+z)<1$. At least one of $L_1$, $L_2$, $L_3$, $Ar_1$ or $Ar_2$ is halogenated.

Still another aspect of this description relates to a method for forming a semiconductor device. The method includes depositing a material layer over a substrate, applying a photoresist composition comprising a polymer and a crosslinker over the material layer to form a photoresist layer, exposing the photoresist layer to an extreme ultraviolet (EUV) radiation, heating the photoresist layer, during which the polymer reacts with the crosslinker to form a crosslinked polymer in exposed regions of the photoresist layer, removing unexposed regions of the photoresist layer to form a patterned photoresist layer, and removing portions of the material layer not covered by the patterned photoresist layer. The polymer has the following structure (III):

(III)

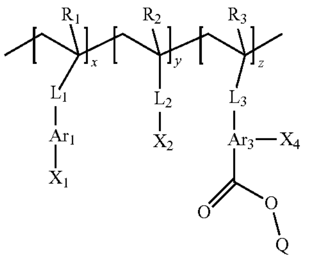

In structure (III), $L_1$, $L_2$ and $L_3$ are, at each occurrence, independently a direct bond or a linker selected from oxy, carboxyl, carbonyloxy, oxycarbonyl, carbonate, halogenated or non-halogenated alkylene, halogenated or non-halogenated cycloalkylene, halogenated or non-halogenated oxyalkylene, halogenated or non-halogenated oxycycloalkylene, halogenated or non-halogenated carbonyloxyalkylene, halogenated or non-halogenated heteroalkylene, or halogenated or non-halogenated cycloheteroalkylene. $Ar_1$ and $Ar_3$ are, at each occurrence, independently halogenated or non-halogenated arylene or halogenated or non-halogenated heteroarylene. Q is, at occurrence, independently an acid labile group. $X_1$, $X_2$ and $X_4$ are, at each occurrence, independently a reactive group, or protected form thereof, capable of forming a covalent bond with the crosslinker. $R_1$, $R_2$ and $R_3$ are, at each occurrence, independently H, alkyl or alkoxy. A portion of x, y and z in the polymer is $0<x/(x+y+z)<1$, $0\leq y/(x+y+z)<1$ and $0<z/(x+y+z)<1$. At least one of $L_1$, $L_2$, $L_3$, $Ar_1$ or $Ar_4$ is halogenated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

forming a photoresist layer over a substrate, wherein the photoresist layer comprises a polymer, a crosslinker and a photoactive compound;

exposing the photoresist layer to radiation to form a pattern therein; and selectively removing portions of the photoresist layer that are not exposed to the radiation to form a patterned photoresist layer, wherein the polymer has the following structure (I):

(I)

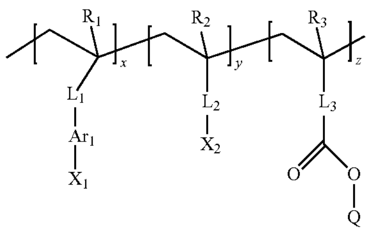

wherein:

$L_1$, $L_2$ and $L_3$ are, at each occurrence, independently a direct bond or a linker selected from oxy, carbonyl, carbonyloxy, oxycarbonyl, carbonate, halogenated or non-halogenated alkylene, halogenated or non-halogenated cycloalkylene, halogenated or non-halogenated oxyalkylene, halogenated or non-halogenated oxycycloalkylene, halogenated or non-halogenated carbonyloxyalkylene, halogenated or non-halogenated heteroalkylene, or halogenated or non-halogenated cycloheteroalkylene;

$Ar_1$ is, at each occurrence, independently halogenated or non-halogenated arylene or halogenated or non-halogenated heteroarylene;

Q is, at occurrence, independently an acid labile group;

$X_1$ and $X_2$ are, at each occurrence, independently a reactive group, or protected form thereof, capable of forming a covalent bond with the crosslinker;

$R_1$, $R_2$ and $R_3$ are, at each occurrence, independently H, alkyl or alkoxy; and $0<x/(x+y+z)<1$, $0\leq y/(x+y+z)<1$ and $0<z/(x+y+z)<1$, provided that at least one of $L_1$ and $L_2$ is halogenated when $y>0$ and that $L_1$ is halogenated alkylene when $y=0$.

2. The method of claim 1, wherein the at least one of $L_1$ and $L_2$ is fluorinated.

3. The method of claim 1, wherein $L_1$ or $L_3$, or both, is a direct bond, and $L_2$ is fluoroalkylene.

4. The method of claim 1, wherein $L_1$, $L_2$ and $L_3$ are each independently a direct bond, carbonyloxy or fluoroalkylene.

5. The method of claim 4, wherein $L_1$, $L_2$ and $L_3$ each independently have one of the following structures:

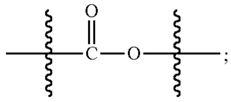 ; 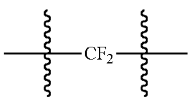 ;

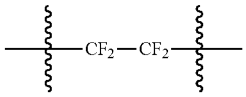 or 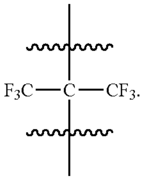 .

6. The method of claim 1, wherein $Ar_1$ has one of the following structures:

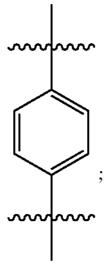 ; 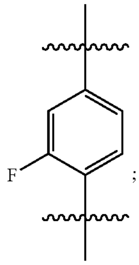 ; 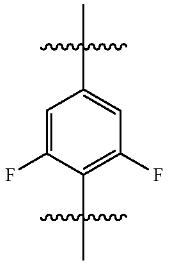 or

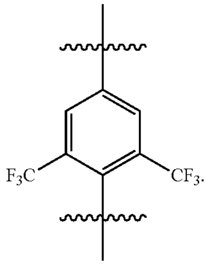 .

7. The method of claim 1, wherein Q is, at each occurrence, independently an alkyl group, a cycloalkyl group, a hydroxyalkyl group, an alkoxy group, an alkoxyalkyl group or a group having a three-dimensional (3D) ring structure.

8. The method of claim 7, wherein the 3D ring structure is adamantyl, cedryl, norbornyl or tricyclodecanyl.

9. The method of claim 1, wherein Q has one of the following structures:

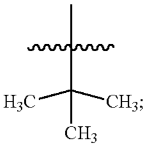
;
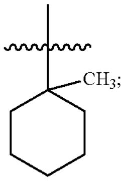
;
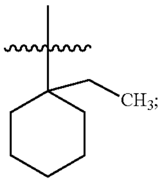
;
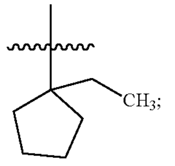
;
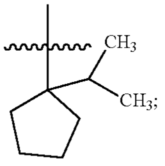
;
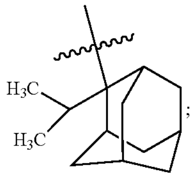
;
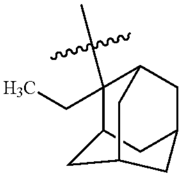
;
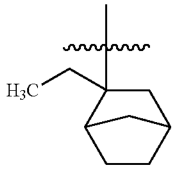
or
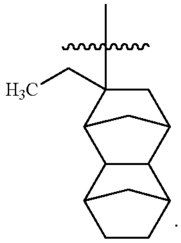
.

10. The method of claim 1, wherein $X_1$ and $X_2$ are, at each occurrence, independently hydroxyl, alkoxy, amine, thiol, ester, melamine, alkene, alkyne, epoxy, aziridine, oxetane, aldehyde, ketone or a carboxylic acid.

11. The method of claim 1, wherein $R_1$, $R_2$ and $R_3$ are each independently H or methyl.

12. The method of claim 1, wherein the polymer has one of the following structures:

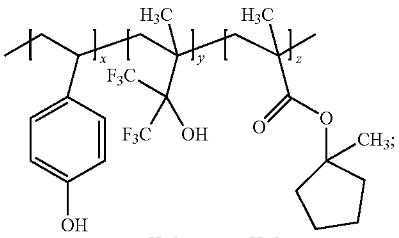
;
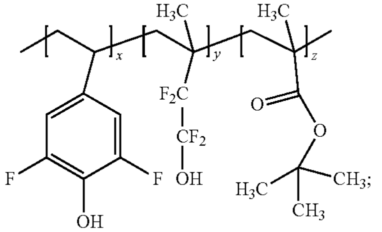
or

-continued

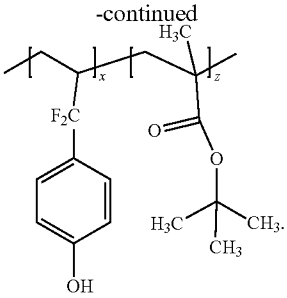
.

13. The method of claim 1, wherein $L_1$ and $L_2$ are fluoroalkylene, and $L_3$ is a direct bond, wherein the polymer has the following structure (Ia):

(Ia)

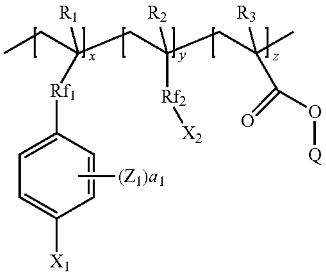

wherein:

$R_1$, $R_2$ and $R_3$ are, at each occurrence, independently H or alkyl;

$Rf_1$ and $Rf_2$ are, at each occurrence, independently fluoroalkylene;

$Z_1$ is, at each occurrence, independently F or fluoroalkyl;

Q is, at each occurrence, independently an alkyl group, a cycloalkyl group, a hydroxyalkyl group, an alkoxy group, an alkoxyalkyl group, an adamantyl group, a cedryl group, a norbornyl group, or a tricyclodecanyl group;

$X_1$ and $X_2$ are, at each occurrence, independently hydroxyl, epoxy, melamine, alkene, or alkyne;

$a_1$ is, at each occurrence, an integer from 0 to 4; and $0<x/(x+y+z)<1$, $0<y/(x+y+z)<1$ and $0<z/(x+y+z)<1$.

14. The method of claim 1, wherein $L_1$ and $L_3$ are each a direct bond and $L_2$ is fluoroalkylene, wherein the polymer has the following structure (Ib):

(Ib)

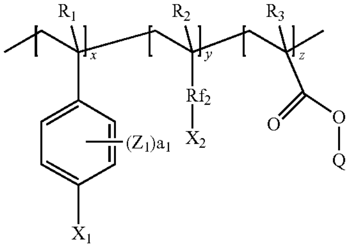

wherein:

$R_1$, $R_2$ and $R_3$ are, at each occurrence, independently H or alkyl;

$Rf_2$ is, at each occurrence, independently fluoroalkylene;

$Z_1$ is, at each occurrence, independently F or fluoroalkyl;

Q is, at each occurrence, independently an alkyl group, a cycloalkyl group, a hydroxyalkyl group, an alkoxy group, an alkoxyalkyl group, an adamantyl group, a cedryl group, a norbornyl group, or a tricyclodecanyl group;

$X_1$ and $X_2$ are, at each occurrence, independently hydroxyl, epoxy, melamine, alkene, or alkyne; and $a_1$ is, at each occurrence, an integer from 0 to 4; and $0<x/(x+y+z)<1$, $0<y/(x+y+z)<1$ and $0<z/(x+y+z)<1$.

15. The method of claim 1, wherein y is 0, $L_1$ is fluoroalkylene and $L_3$ is a direct bond, wherein the polymer has the following structure (Ic):

(Ic)

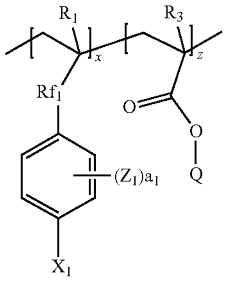

wherein:

$R_1$ and $R_3$ are, at each occurrence, independently H or alkyl;

$Rf_1$ is, at each occurrence, independently fluoroalkylene;

$Z_1$ is, at each occurrence, independently F or fluoroalkyl;

Q is, at each occurrence, independently an alkyl group, a cycloalkyl group, a hydroxyalkyl group, an alkoxy group, an alkoxyalkyl group, an adamantyl group, a cedryl group, a norbornyl group, or a tricyclodecanyl group;

$X_1$ is, at each occurrence, independently hydroxyl, epoxy, melamine, alkene, or alkyne;

$a_1$ is, at each occurrence, an integer from 0 to 4, and $0<x/(x+y+z)<1$ and $0<z/(x+y+z)<1$.

16. A method of forming a semiconductor device, comprising:

depositing a photoresist layer over a material layer on a substrate, wherein the photoresist layer comprises a polymer, a crosslinker and a photoacid generator;

exposing the photoresist layer to radiation, thereby forming a crosslinked polymer in portions of the photoresist layer exposed to the radiation;

developing the photoresist layer to form a patterned photoresist layer; and etching the material layer using the patterned photoresist layer as an etch mask, wherein the polymer has the following structure (I):

(I)

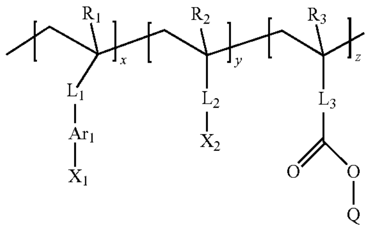

wherein:

$L_1$ and $L_2$ are, at each occurrence, independently a direct bond or a carbonyloxy or halogenated alkylene linker, provided that at least one of $L_1$ and $L_2$ is a halogenated alkylene linker;

$L_3$ is, at each occurrence, a direct bond;

$Ar_1$ is, at each occurrence, independently halogenated or non-halogenated arylene or halogenated or non-halogenated heteroarylene;

Q is, at occurrence, independently an acid labile group;

$X_1$ and $X_2$ are, at each occurrence, independently a reactive group, or protected form thereof, capable of forming a covalent bond with the crosslinker;

$R_1$, $R_2$ and $R_3$ are, at each occurrence, independently H, alkyl or alkoxy; and $0<x/(x+y+z)<1$, $0<y/(x+y+z)<1$ and $0<z/(x+y+z)<1$.

17. The method of claim 16, wherein:

$L_1$ and $L_2$ each independently have one of the following structures:

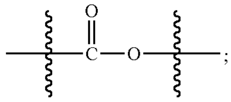
;
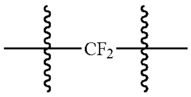
;

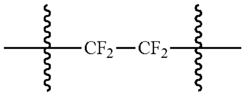
or
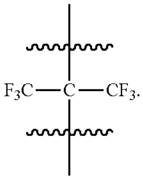
.

$Ar_1$ has one of the following structures:

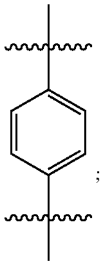
;
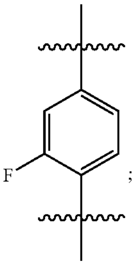
;
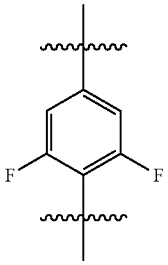
or

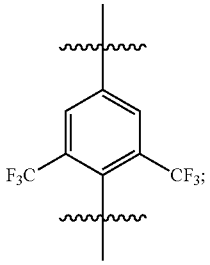
;

Q has one of the following structures:

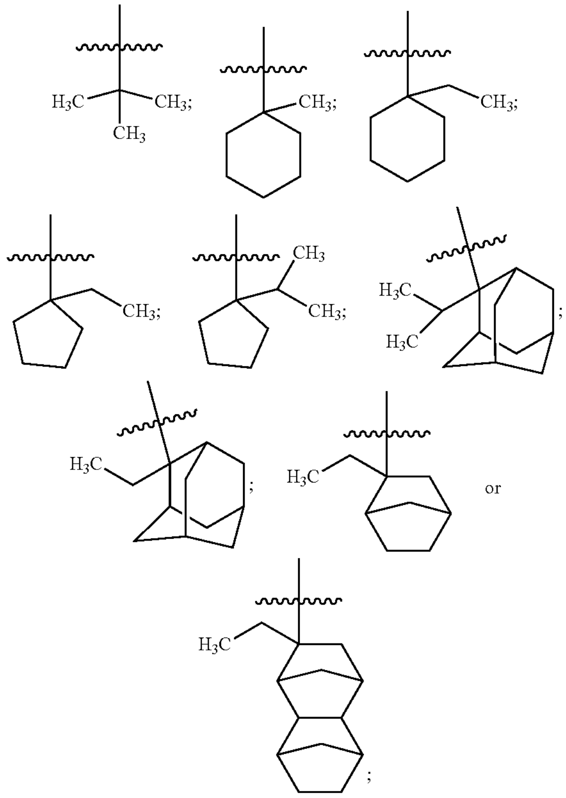

or $X_1$ and $X_2$ are, at each occurrence, independently hydroxyl, alkoxy, amine, thiol, ester, melamine, alkene, alkyne, epoxy, aziridine, oxetane, aldehyde, ketone or a carboxylic acid; and $R_1$, $R_2$ and $R_3$ are each independently H or methyl.

18. The method of claim 16, wherein the polymer has one of the following structures:

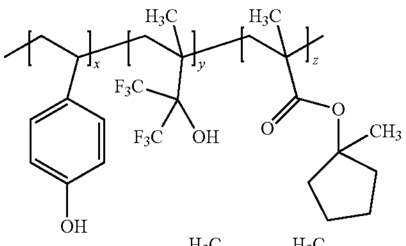

or

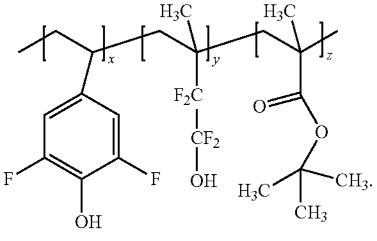

19. A method of forming a semiconductor device, comprising:

depositing a material layer over a substrate;

applying a photoresist composition comprising a polymer, a crosslinker and a photoacid generator over the material layer to form a photoresist layer;

exposing the photoresist layer to an extreme ultraviolet (EUV) radiation to generate a photoacid, which catalyzes the reaction between the polymer and the crosslinker to form a crosslinked polymer in exposed regions of the photoresist layer;

baking the photoresist layer;

removing exposed or unexposed regions of the photoresist layer to form a patterned photoresist layer; and etching the material layer using the patterned photoresist layer as an etch mask, wherein the polymer has the following structure (Ia):

(Ia)

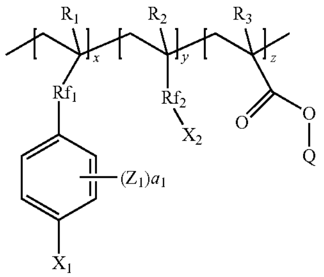

wherein:

$R_1$, $R_2$ and $R_3$ are, at each occurrence, independently H or alkyl;

$Rf_1$ and $Rf_2$ are, at each occurrence, independently fluoroalkylene;

$Z_1$ is, at each occurrence, independently F or fluoroalkyl;

Q is, at each occurrence, independently an alkyl group, a cycloalkyl group, a hydroxyalkyl group, an alkoxy group, an alkoxyalkyl group, an adamantyl group, a cedryl group, a norbornyl group, or a tricyclodecanyl group;

$X_1$ and $X_2$ are, at each occurrence, independently hydroxyl, epoxy, melamine, alkene, or alkyne;

$a_1$ is, at each occurrence, an integer from 0 to 4; and $0<x/(x+y+z)<1$, $0\leq y/(x+y+z)<1$ and $0<z/(x+y+z)<1$.

20. The method of claim 19, further comprising baking the photoresist layer prior to exposing the photoresist layer to the EUV radiation.

* * * * *